US012633932B2

(12) United States Patent (10) Patent No.: US 12,633,932 B2

Gunasekaran et al. (45) Date of Patent: May 19, 2026

(54) HYBRID FRACTIONAL PHASE-LOCKED LOOP

(71) Applicant: Texas Instruments Incorporated, Dallas, TX (US)

(72) Inventors: Karthikeyan Gunasekaran, Bangalore (IN); Viswanathan Nagarajan, Bangalore (IN); Shalu Francis, Kozhikode (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/901,041

(22) Filed: Sep. 30, 2024

(65) Prior Publication Data

US 2026/0095186 A1 Apr. 2, 2026

(51) Int. Cl.
| | |
|---|---|
| *H03L 7/099* | (2006.01) |
| *H03L 7/089* | (2006.01) |
| *H03M 7/32* | (2006.01) |

(52) U.S. Cl.
CPC .......... *H03L 7/0992* (2013.01); *H03L 7/0891* (2013.01); *H03M 7/3015* (2013.01)

(58) Field of Classification Search
CPC ... H03L 7/0992; H03L 7/0891; H03M 7/3015
See application file for complete search history.

(56) References Cited

U.S. PATENT DOCUMENTS

| | | | | |
|---|---|---|---|---|
| 6,466,096 B1 * | 10/2002 | DeVito | .................. | H03L 7/087 |
| | | | | 331/11 |
| 2005/0242851 A1 * | 11/2005 | Booth | ..................... | H03L 7/197 |
| | | | | 327/156 |
| 2005/0264368 A1 * | 12/2005 | Gotz | .................... | H03L 7/1075 |
| | | | | 331/16 |
| 2023/0283287 A1 * | 9/2023 | Jankowski | ............. | H03L 7/093 |
| | | | | 341/143 |

FOREIGN PATENT DOCUMENTS

| | | | | |
|---|---|---|---|---|
| EP | 1394949 A1 * | 3/2004 | .............. | H03L 7/00 |

OTHER PUBLICATIONS

Riley et al., "Delta-sigma modulation in fractional-N frequency synthesis," vol. 28, No. 5, J. Solid-State Circ. (IEEE, 1993), pp. 553-559.

(Continued)

*Primary Examiner* — Freshteh N Aghdam

(74) *Attorney, Agent, or Firm* — Xianghui Huang; Frank D. Cimino

(57) ABSTRACT

A phase-locked loop circuit including a phase detector having a reference clock input; a charge pump having an input coupled to an output of the phase detector; a non-integrating loop filter having an input coupled to an output of the charge pump; a voltage adder having a first input coupled to an output of the loop filter, a voltage-controlled oscillator (VCO) having an input coupled to an output of the voltage adder; and a first frequency divider having an input coupled to an output of the VCO, and an output coupled to the second input of the phase detector. The circuit further (Continued)

includes frequency control circuitry that has an input coupled to the output of the VCO, a reference clock input, and an output coupled to a second input of the voltage adder.

21 Claims, 16 Drawing Sheets

(56) References Cited

OTHER PUBLICATIONS

Gaied et al., "Charge-Pump Folded Noise Cancelation in Fractional-N Phase-Locked Loops," vol. 61, No. 6, Trans. Circ. and Sys. II: Express Briefs (IEEE, 2014), pp. 378-382.

Jiang et al., "A 2.3-3.9 GHZ Fractional-N Frequency Synthesizer with Charge Pump and TDC Calibration for Reduced Reference and Fractional Spurs," Radio Freq. Int. Circ. Symp. (RFIC) (IEEE, 2021), pp. 71-74.

Abdul et al., "A Linearized Charge Pump for Power and Phase Noise Efficient Fractional-N PLL Design," 5th Int'l Conf. on Trends in Electronics and Informatics (ICOEI) (IEEE, 2021), pp. 1162-1165.

Lin et al., "Dynamic Current-Matching Charge Pump and Gated-Offset Linearization Technique for Delta-Sigma Fractional-N PLLs," vol. 56, No. 5, Trans. Circ. and Sys. I: Regular Papers (IEEE, 2009), pp. 877-885.

"DS90UB984-Q1 4K FPD-Link IV to Embedded DisplayPort Bridge Deserializer", Datasheet SNLS760 (Texas Instruments Incorporated, Feb. 2024).

Barrett, "Fractional/Integer-N PLL Basics", Technical Brief SWRA029 (Texas Instruments Incorporated, 1999).

* cited by examiner

HYBRID FRACTIONAL PHASE-LOCKED LOOP

BACKGROUND

This specification relates to frequency synthesis circuits, and more particularly to clock generator circuits of the phase-locked loop (PLL) type.

Frequency synthesis circuits, also referred to as clock generator circuits, are commonly used in many electronic systems to generate stable periodic signals, such as clock signals. These generated clock signals are used to clock data converter circuits, for example analog-to-digital and digital-to-analog converters, as system clocks in digital processing circuits, as reference clocks in test and measurement systems, and the like. Some wireless and wireline communications transceivers include frequency synthesis circuits in the form of local oscillators that generate clock signals used in the down-conversion of received signals and the up-conversion of signals to be transmitted.

Frequency synthesis connotes the generation of a clock signal at a frequency different from that of the reference clock. A common type of frequency synthesis circuit is those based on a phase-locked loop (PLL). In general, a PLL includes an oscillator that generates an output clock signal at a phase and frequency in response to a phase difference between the input (e.g., reference) clock signal and a feedback signal generated from the output clock signal itself. A frequency divider in the feedback loop determines the relationship between the output clock signal and the reference clock signal.

PLLs may also be used in applications other than clock generation or frequency synthesis. Such other applications include, for example, clock recovery, clock deskewing, demodulation and detection, jitter and noise reduction, and the like.

A simple form of PLL-based frequency synthesis includes an integer frequency divider in the feedback loop. This frequency divider produces a feedback signal at a frequency divided down by an integer value from the output clock signal, and generates the output clock signal at a frequency that is an integer multiple of the reference clock frequency.

Fractional PLLs generate an output clock signal at a frequency that is a non-integer multiple of the reference clock signal. This is accomplished by the frequency divider in the feedback loop dividing down the output clock signal by a divisor value that has a fractional portion. FIG. 1A illustrates a prior art example fractional PLL 100. PLL 100 includes phase-frequency detector (PFD) 102, charge pump 110, loop filter 120, voltage-controlled oscillator (VCO) 130, multi-modulus frequency divider (MMD) 140, delta-sigma modulator (DSM) 142, and register 144.

PFD 102 has one input receiving reference clock signal REF, and another input receiving feedback signal FB from an output of MMD 140. An output of PFD 102 is coupled to an input of charge pump 110, specifically to the gates of p-channel metal-oxide-semiconductor (PMOS) transistor 112 and n-channel metal-oxide-semiconductor (NMOS) transistor 113. Current source 111 has one terminal coupled to a power supply terminal and another terminal coupled to the source of PMOS transistor 112. Current source 114 has one terminal coupled to the source of NMOS transistor 113 and another terminal coupled to a common potential (e.g., circuit ground). The drains of PMOS transistor 112 and NMOS transistor 113 are coupled together, and constitute an output of charge pump 110.

Loop filter 120 in this example includes resistor 121, capacitor 122, and capacitor 123. Resistor 121 has one terminal coupled to the output of charge pump 110 (e.g., at the drains of transistors 112 and 113), and another terminal coupled to a terminal of capacitor 122. Capacitor 122 has a second terminal coupled to circuit ground. Capacitor 123 has a terminal coupled to the output of charge pump 110 and another terminal coupled to circuit ground. Loop filter 120 operates to filter voltages at the output of charge pump 110, to establish an input voltage to VCO 130. VCO 130 has an input coupled to the output of charge pump 110, to which loop filter 120 is coupled, and an output generating output clock signal OUT at a frequency $f_{OUT}$ that is responsive to the filtered voltage at the input of VCO 130.

In the feedback loop, MMD 140 has an output coupled to the output of VCO 130 to receive output clock signal OUT. MMD 140 has a control input coupled to an output of DSM 142. DSM 142 has an input coupled to the output of MMD 140 and an input coupled to register 144. Register 144 stores a frequency multiple value frac(N) indicating the intended frequency multiple of the output clock frequency $f_{OUT}$ relative to the reference clock frequency $f_{REF}$, and thus constitutes the divisor value by which MMD 140 divides down the frequency of output clock signal OUT to produce feedback signal FB. This frequency multiple value frac(N) includes a fractional portion.

In operation, PFD 102 turns on one of PMOS transistor 112 or NMOS transistor 113 in response to the phase relationship between reference clock signal REF and feedback signal FB. This raises or lowers the voltage at the output of charge pump 110, and thus at the input of VCO 130, as filtered over time by the passive components of loop filter 120. VCO 130 adjusts the phase, and thus frequency $f_{OUT}$ of output clock signal OUT, in response to changes in that voltage.

Fractional frequency division is accomplished by MMD 140 alternating, or dithering, between two divisor values according to the output of DSM 142. For example, if output clock frequency $f_{OUT}$ is to be a multiple of 8.5 times the reference clock frequency $f_{REF}$, DSM 142 controls MMD 140 to divide output clock signal OUT by a factor of 8 approximately half of the time, and by a factor of 9 the remainder of the time. Control of which of the two divisor values is applied by MMD 140 for any given cycle of feedback clock signal FB is provided by DSM 142 in response to the frequency multiple value frac(N) stored in register 144.

SUMMARY

According to an example, a phase-locked loop circuit includes a phase detector having a reference clock input; a charge pump having an input coupled to an output of the phase detector; a non-integrating loop filter having an input coupled to an output of the charge pump; a voltage adder having a first input coupled to an output of the loop filter, a voltage-controlled oscillator (VCO) having an input coupled to an output of the voltage adder; and a first frequency divider having an input coupled to an output of the VCO, and an output coupled to the second input of the phase detector. The circuit further includes frequency control circuitry that has an input coupled to the output of the VCO, a reference clock input, and an output coupled to a second input of the voltage adder.

According to another example, a phase-locked loop circuit includes a phase detector having a first input receiving a reference clock signal and a second input receiving a feedback clock signal; a charge pump having an input coupled to an output of the phase detector; a non-integrating loop filter having an input coupled to an output of the charge pump; a voltage adder having a first input coupled to an output of the loop filter; a VCO configured to output an output clock signal at a phase and frequency corresponding to a voltage at an output of the voltage adder; and a feedback circuit having an input coupled to an output of the VCO, the feedback circuit configured to output, to a second input of the phase detector, a feedback clock signal at a frequency divided from the output clock signal by a divisor value. The circuit further includes frequency control circuitry having a first input receiving the output clock signal and a second input receiving the reference clock signal. The frequency control circuitry configured to apply a voltage to the second input of the voltage adder responsive to a comparison of a frequency of the output clock signal with a product of a frequency of the reference clock signal and the divisor value.

According to another example, a method includes detecting a phase difference between an input signal and a feedback signal; controlling a charge pump responsive to the detected phase difference; filtering an output voltage from the charge pump with a non-integrating filter to produce a first voltage controlled oscillator (VCO) input voltage; generating an output signal from a VCO responsive to a sum of the first VCO input voltage and a second VCO input voltage; and generating the feedback signal by dividing down the frequency of the output signal by a divisor value. The method further includes generating the second VCO input voltage responsive to a comparison of a frequency of the output signal with a product of the frequency of the input signal and the divisor value.

Example technical advantages in clock generation circuits enabled by one or more of these examples include improved low frequency phase noise performance and reduction in the power of close-in reference spurs. Other example technical advantages enabled by this description are apparent to those of ordinary skill in the art having reference to the following specification together with its drawings.

BRIEF DESCRIPTION OF THE DRAWINGS

The same reference numbers or other reference designators are used in the drawings to illustrate the same or similar (in function and/or structure) features.

DETAILED DESCRIPTION

Figure 1A:
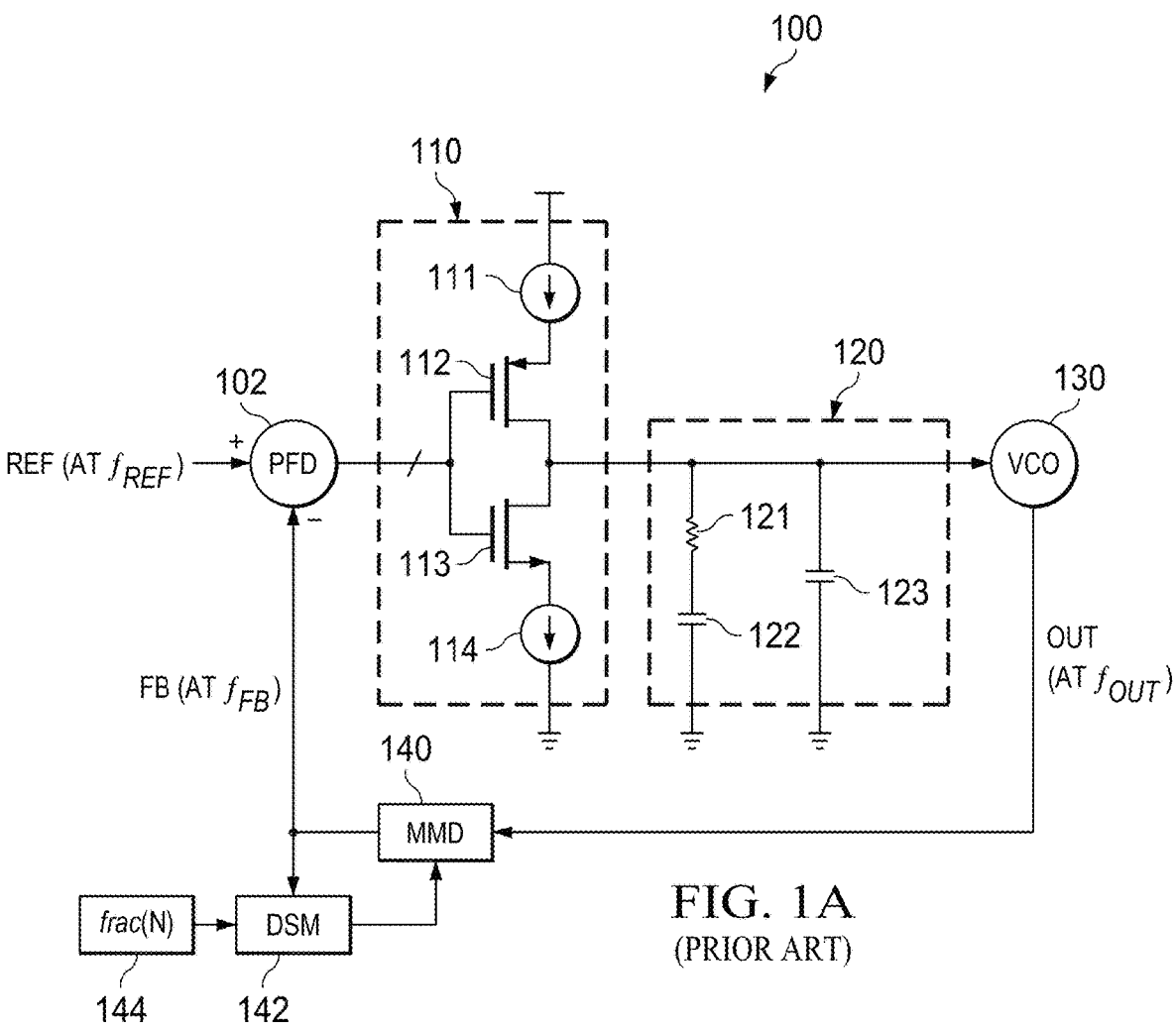
FIG. 1A is an electrical diagram, in block form, of a prior art phase-locked loop (PLL).
Figure 1B:
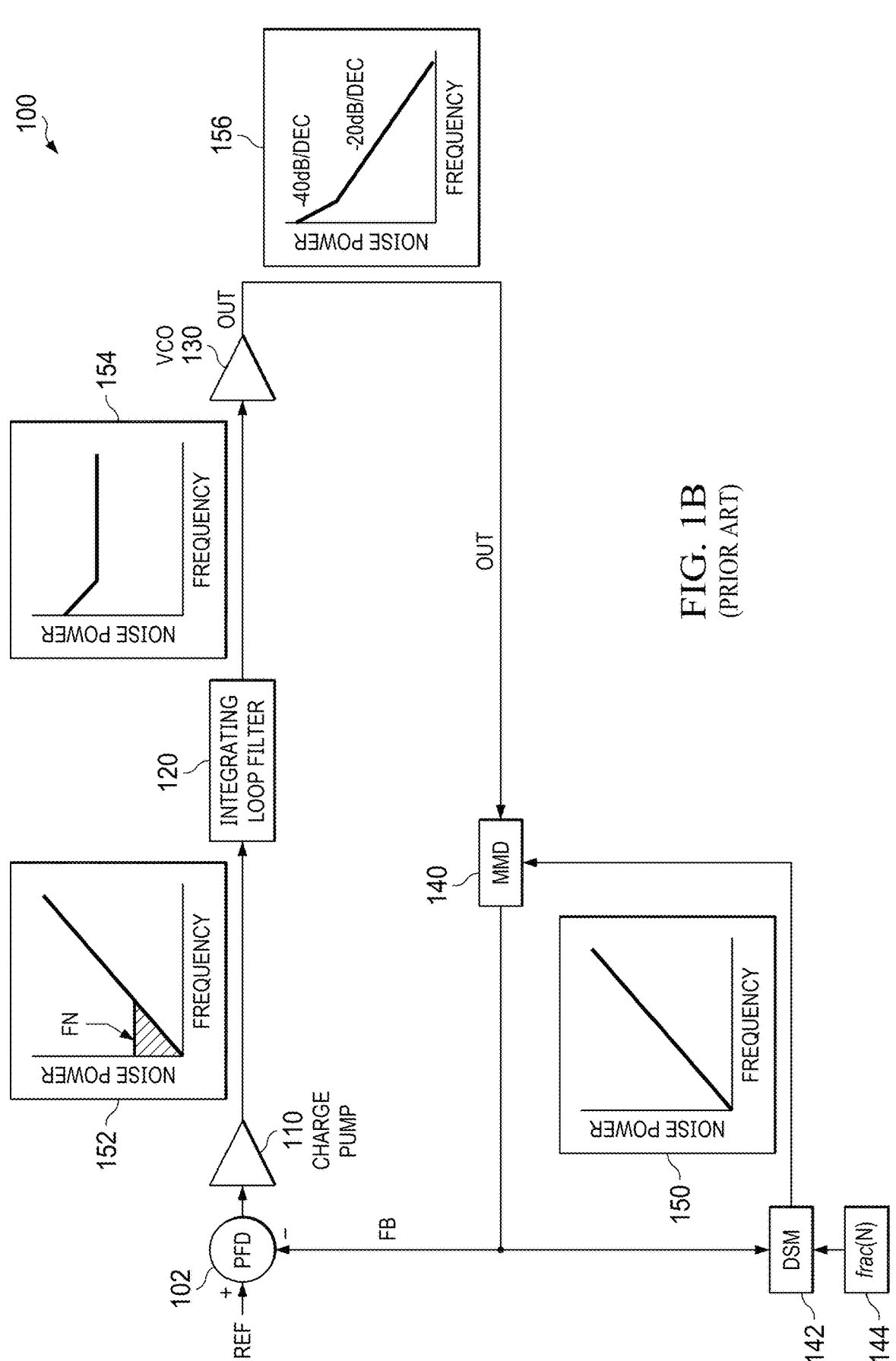
FIGS. 1B and 1C are electrical diagrams, in block form, of the prior art PLL of FIG. 1A and illustrating noise power spectra at various points in the circuit.

FIG. 1B illustrates prior art example PLL 100 of FIG. 1A in block form, in combination with noise spectra at various ones of its nodes. Noise spectrum 150 qualitatively illustrates the noise power at the output of DSM 142. This noise represented in spectrum 150 corresponds to the quantization noise of DSM 142, and exhibits a high-pass shape (e.g., increasing with frequency). This quantization noise appears in feedback signal FB, and at the output of phase-frequency detector (PFD) 102.

Charge pump 110, for example constructed as shown in FIG. 1A, inserts non-linearities into the signal at its output. These non-linearities can cause "folding" of high frequency quantization noise in the signal from phase detector 102 into low frequency components (including DC) of the signal at the output of charge pump 110. Spectrum 152 qualitatively illustrates this folded noise FN at DC (f=0) and low frequencies, which is present in the signal output by charge pump 110 to integrating loop filter 120.

Integrating loop filter 120, as constructed in the prior art example of FIG. 1A, applies a transfer function to the output signal from charge pump 110 in the form of:

$$\frac{1}{s} \cdot \frac{sR_{121}C_{123} + 1}{(sR_{121}C_{122}C_{123} + (C_{122} + C_{123}))} \tag{1}$$

where $R_{121}$ is the resistance of resistor 121, $C_{122}$ and $C_{123}$ are the capacitances of capacitors 122 and 123, respectively, and s is the Laplace variable. The integration applied by integrating loop filter 120 is represented in this transfer function by the 1/s term, and results in amplification of the folded low frequency noise as shown in spectrum 154 of FIG. 1B. Spectrum 154 represents the signal at the output of integrating loop filter 120, which is applied to the input of VCO 130 in PLL 100.

The DC and low frequency components in the noise spectrum 154 of the signal at the input of VCO 110 cause frequency error in output signal OUT. This frequency error is exhibited as "phase noise" or "jitter" in output signal OUT. The feedback loop of PLL 100 attempts to correct for this frequency error by forming a phase offset between feedback signal FB and reference clock signal REF that builds a DC component into the control voltage applied to VCO 130. Spectrum 156 of FIG. 1B qualitatively illustrates the phase noise ("jitter") over frequency in output signal OUT. The two slopes (−40 dB/decade and −20 dB/decade) exhibit the effect of two stages of integration in the PLL loop, one stage in integrating loop filter 120 and the other in VCO 130. The accumulation of DSM quantization noise in integrating loop filter 120 degrades the output phase noise performance of prior art example PLL 100, as evident in spectrum 156.

In many fractional PLLs such as PLL 100, DSM 142 controls multi-modulus divider (MMD) (140) to divide the frequency $f_{OUT}$ of output signal OUT by one of two divisors N and N+1. Divisor N is the integer value below the frequency multiple portion frac(N) stored in register 144, and divisor N+1 the next higher integer value above the frequency multiple frac(N). Within each group of q cycles, DSM 142 controls MMD 140 to divide frequency f$_{OUT}$ by
the divisor N in p of those cycles, and control MMD 140 to
divide frequency f$_{OUT}$ by the divisor N+1 in the other q-p
cycles. On average in this case, MMD 140 thus divides
frequency f$_{OUT}$ by the value:

$$N + \frac{q-p}{q} \qquad (2)$$

For example, an average frequency division of 8.1 could
be performed by controlling MMD 140 to divide frequency
f$_{OUT}$ by N=8 in nine out of every 10 cycles, and to divide
frequency f$_{OUT}$ by N+1=9 in the remaining one of ten cycles
(e.g., p=9 and q=10).

Figure 1C:
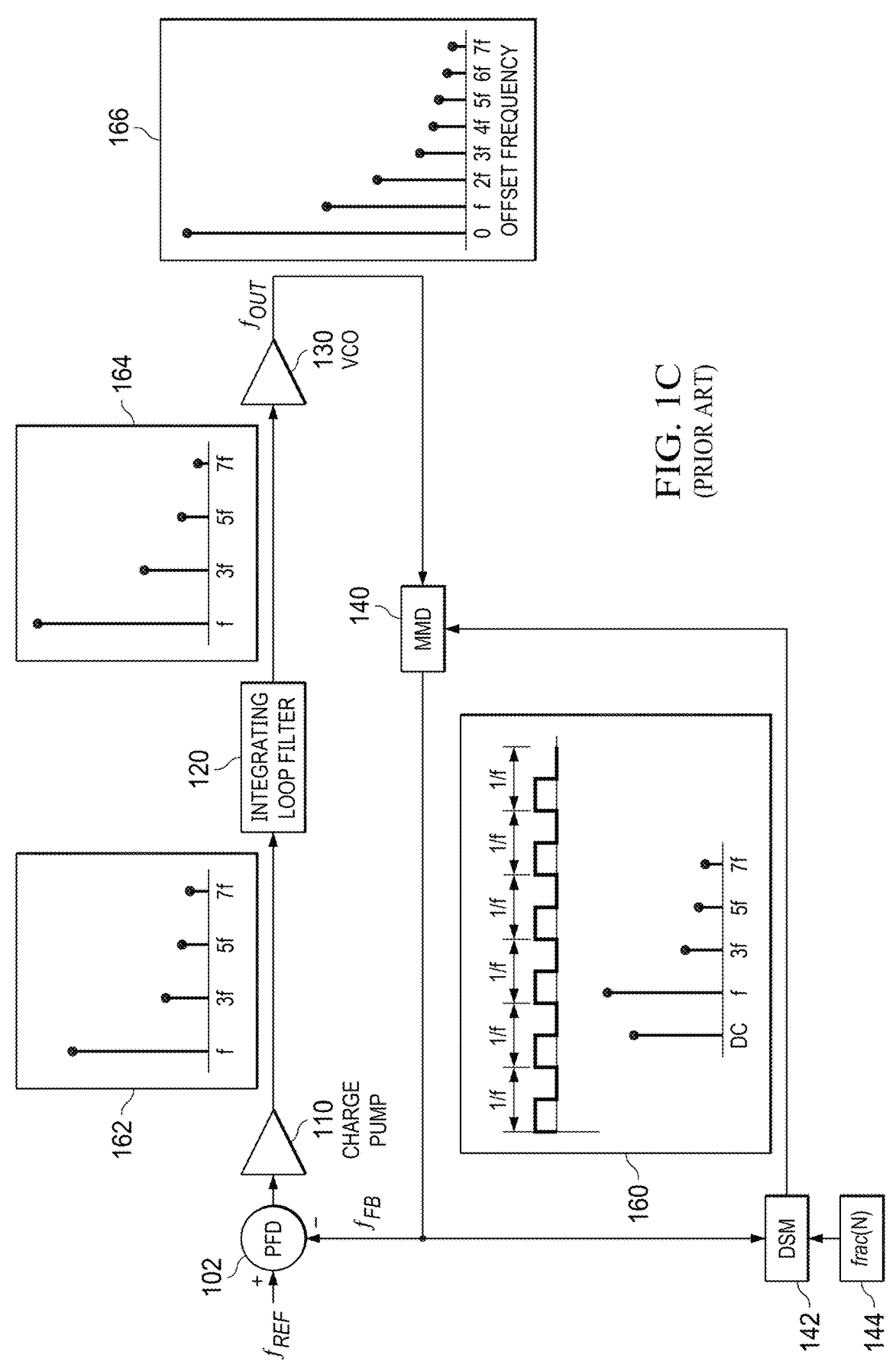

To attain this alternating divisor value, DSM 142 may
apply a pattern of p logic "1" levels and q-p logic "0" values
to the control input of MMD 140, with the pattern repeating
every q cycles of reference clock signal REF. This repeating
pattern introduces "spurs" into the PLL loop at DC and at
odd multiples of f$_{REF}$/q. FIG. 1C illustrates PLL 100 of FIG.
1A along with an example power spectrum 160 of these
least-common-multiple (LCM) reference spurs, as present at
the output of DSM 142.

Spectrum 162 represents the noise power of the odd
multiple LCM reference spurs at the output of charge pump
110, and as applied to the input of integrating loop filter 120.
As in the case of quantization noise described above relative
to FIG. 1B, integrating loop filter 120 amplifies the lower
frequency LCM reference spurs output by charge pump 110,
while attenuating the higher frequency spurs, as shown by
noise spectrum 164 of FIG. 1C. These amplified spurs at the
input of VCO 130 modulate its output, causing spurs on
output signal OUT at the LCM reference frequency and its
harmonics, as shown by noise spectrum 166 of FIG. 1C.
Again, the integration of lower frequencies by integrating
loop filter 120 exacerbates the effect of these reference spurs
on the output signal. As the number q of cycles increases,
these reference spurs become closer to output frequency f$_{out}$,
and thus more difficult to filter at the output of PLL 100.

It is within this context that the examples described herein
arise.

Figure 2:
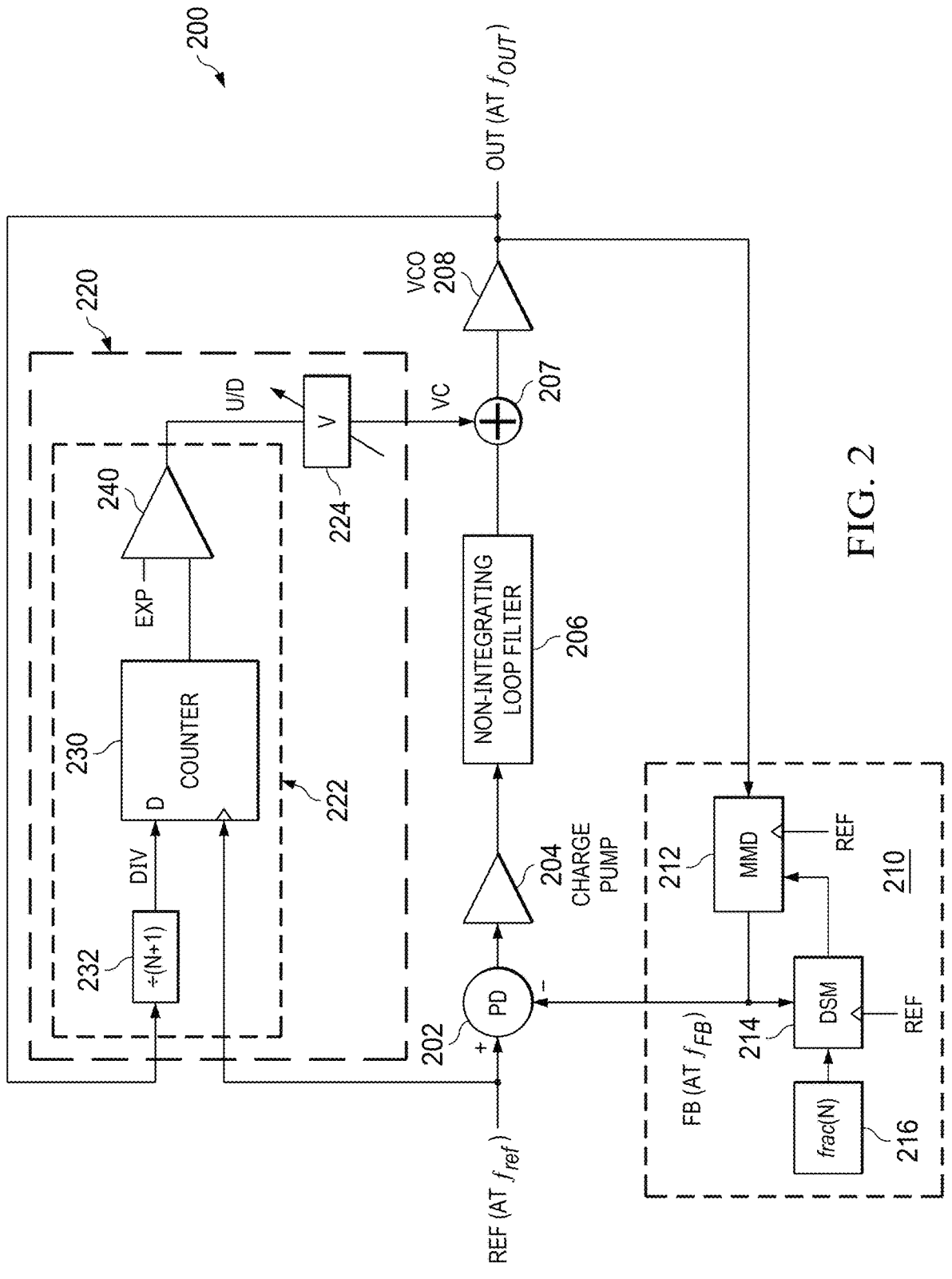
FIG. 2 is an electrical diagram, in block form, of an example PLL.

FIG. 2 illustrates an example PLL 200. PLL 200 includes
phase detector 202, charge pump 204, non-integrating loop
filter 206, voltage adder 207, voltage controlled oscillator
(VCO) 208, feedback circuit 210, and frequency control
circuitry 220. Feedback circuit 210 includes multi-modulus
divider (MMD) 212, delta-sigma modulator (DSM) 214, and
register 216. Frequency control circuitry 220 includes fre-
quency control logic 222 and voltage adjustment circuit 224.
Frequency control logic 222 includes counter 230, fre-
quency divider 232, and comparator 240.

Phase detector 202 has one input receiving reference
clock REF, for example from an external source or from a
clock generator circuit on the same integrated circuit as PLL
200. Phase detector 202 has a second input receiving feed-
back signal FB from feedback circuit 210, for example from
an output of MMD 212. Phase detector 202 may be con-
structed as a frequency mixer, an analog multiplier, or a
logic circuit (e.g., an exclusive-OR (XOR) logic gate, or an
arrangement of flip-flops) that generates a signal corre-
sponding to the difference in phase between reference clock
REF and feedback signal FB at its two inputs. For example,
phase detector 202 may produce an output pulse of a polarity
and duration indicating the phase difference.

Charge pump 204 has an input coupled to an output of
phase detector 202. Charge pump 204 may be constructed in
a similar manner as charge pump 110 of FIG. 1A, or
according to an alternative arrangement. For example,
charge pump 204 may be of a "proportional" type that
outputs an amount of charge proportional to the phase error
detected by phase detector 202. In some implementations,
phase detector 202 and charge pump 204 may operate to
produce both up and down control pulses in each cycle, such
that the net charge difference indicates the detected phase
difference.

The output of charge pump 204 is coupled to an input of
non-integrating loop filter 206. As described above in con-
nection with FIGS. 1A through 1C, prior art example PLL
100 included a loop filter 120 with an integrating factor of
1/s in its transfer function, where s is the Laplace variable.
This integrating factor results from the presence of a capaci-
tor 122 in series with resistor 121 in one leg of the example
analog loop filter 120. In contrast, non-integrating loop filter
206 in example PLL 200 of FIG. 2 does not include such an
integrating factor. Rather, non-integrating loop filter 206 in
this example has a transfer function in the form:

$$\frac{R}{sRC+1} \qquad (3)$$

Figure 3:
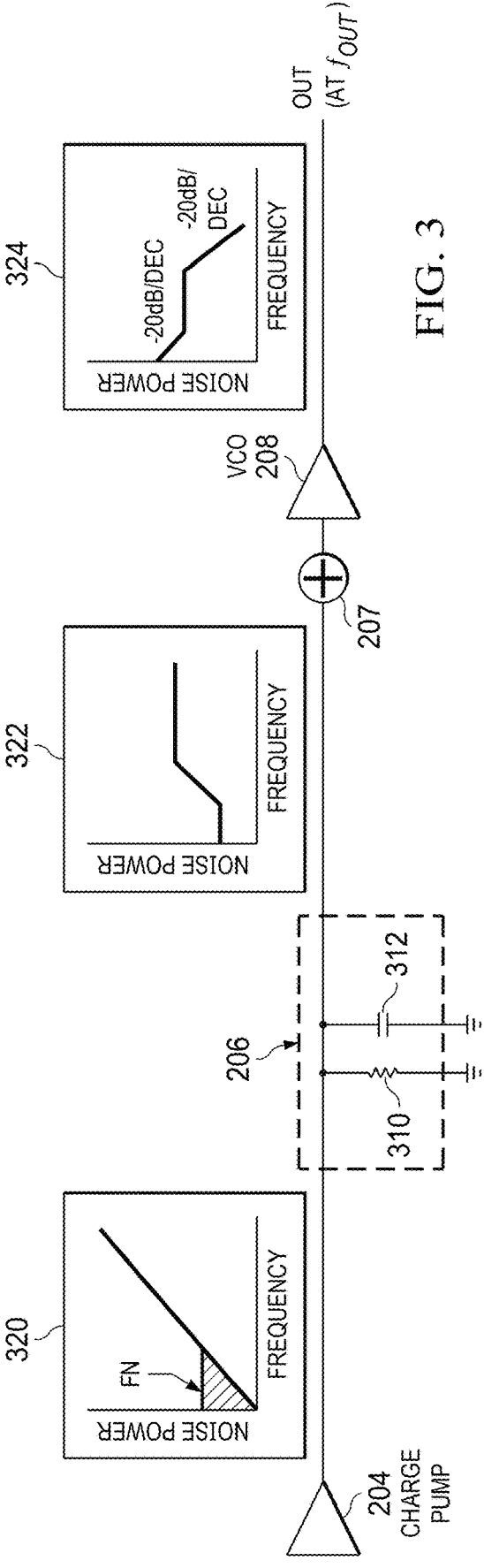
FIG. 3 is an electrical diagram, in block and schematic form, of a portion of the example PLL of FIG. 2 illustrating noise power spectra at various points in the circuit.

FIG. 3 illustrates an example of non-integrating loop filter
206 that provides a transfer function in the form of expres-
sion (2). As shown in FIG. 3, non-integrating loop filter
includes resistor 310 and capacitor 312. Resistor 310 has a
terminal coupled to the output of charge pump 204 and a
terminal coupled to a "common" or "ground" terminal that
provides a common potential (e.g., circuit ground). Capaci-
tor 312 has a terminal coupled to the output of charge pump
204 and the common terminal, in parallel with resistor 310.
This parallel R-C arrangement of loop filter 206 provides the
transfer function of expression (2), where R is the resistance
of resistor 310 and C is the capacitance of capacitor 312. No
integrating factor of 1/s is thus present in the transfer
function of this non-integrating loop filter 206. Non-inte-
grating loop filter 206 may be constructed in other arrange-
ments or with additional or alternative components to pro-
vide a non-integrating transfer function (e.g., without a 1/s
integrating factor).

An output of non-integrating loop filter 206 is coupled to
one input of voltage adder 207. A second input of voltage
adder 207 is coupled to an output of voltage adjustment
circuit 224 in frequency control circuit 220, to receive a
voltage VC. Voltage adder 207 may be constructed as a
summing amplifier, summing inverter, or other type of
operational amplifier circuit configuration, in any case
arranged to combine the voltages at its inputs into a single
output voltage.

The output of voltage adder 207 is coupled to an input of
VCO 208. VCO 208 generates a periodic output signal OUT
at a frequency f$_{OUT}$ that is controlled responsive to the
voltage (e.g., control voltage) applied to its input by voltage
adder 207. Output signal OUT may be applied as a clock
signal to downstream circuit functions (not shown), whether
in the same integrated circuit as, or external to, PLL 200.

An input of MMD 212 in feedback circuit 210 is coupled
to the output of VCO 208, to receive output signal OUT.
MMD 212 has a control input coupled to an output of DSM
214. DSM 214 has an input coupled to register 216 and an
input coupled to an output of MMD 212. MMD 212 and DSM 214 are each clocked by reference clock signal REF. Register 216 stores a frequency multiple value frac(N) indicating the relationship of output frequency $f_{OUT}$ to reference clock frequency $f_{REF}$, for example based on a programmed value or other user input to PLL 200. This frequency multiple value frac(N) also constitutes the divisor by which MMD 212 divides down, on average over a number of cycles, the frequency of output frequency $f_{OUT}$ to generate feedback signal FB at frequency $f_{FB}$.

In the operation of this example, DSM 214 outputs one of two divisor values N and N+1 in each cycle of reference clock signal REF, where divisor value Nis the integer value below frequency multiple value frac(N) (e.g., the integer portion of frac(N)) and divisor value N+1 is the next integer higher than frequency multiple value frac(N). The selection of divisor value N or N+1 is based on a delta-sigma modulation performed by DSM 214 on the frequency multiple value frac(N) stored in register 216. Feedback signal FB is applied by MMD 212 to an input of phase detector 202 for phase comparison with reference clock signal REF, and eventual adjustment of the control voltage at the input of VCO 208 through the operation of charge pump 204, non-integrating loop filter 206, and voltage adder 207.

For example, if the intended frequency multiple for PLL 200 is 8.1 (e.g., $f_{OUT}=8.1*f_{REF}$), DSM 214 outputs integer divisor value m=8 in nine of every ten cycles of reference clock signal REF, and outputs integer divisor value m+1=9 in the tenth of those ten cycles. MMD 212 thus generates a feedback signal FB at a frequency $f_{FB}$ divided down from output signal OUT by m=8 in 90% of the cycles of reference clock signal REF, and divided down by m+1=9 in the remaining 10% of those cycles. In this example, PLL 200 thus provides an output signal at a frequency $f_{OUT}$ that is on average 8.1 times the frequency $f_{REF}$ of reference clock signal.

FIG. 3 illustrates the effect of non-integrating loop filter 206 in example PLL 200 on quantization noise from feedback circuit 210. As described above, non-linearity in charge pump 204 causes high-frequency quantization noise to fold into DC and lower frequencies. Plot 320 shows a noise power spectrum at the output of charge pump 204 in example PLL 200. The folded quantization noise from charge pump 204 is shown as portion FN, appearing at lower frequencies in plot 320.

As described above, non-integrating loop filter 206 in this example is a parallel RC filter, with resistor 310 and capacitor 312 coupled in parallel between the output of charge pump 204 and circuit ground. With this construction, the transfer function of this example of non-integrating loop filter 206 is:

$$\frac{R_{310}}{sR_{310}C_{312} + 1} \quad (4)$$

where $R_{310}$ is the resistance of resistor 310, $C_{310}$ is the resistance of capacitor 312, and s is the Laplace variable. Because this transfer function of expression (3) does not include an integrating 1/s term, low frequency noise is not amplified by loop filter 206 as in the prior art example described above relative to FIG. 1B. As shown in the noise power spectrum of plot 322 in FIG. 3, the noise power of DC and low frequency folded noise FN as output from charge pump 204 is not significantly affected by non-integrating loop filter 206.

To the extent that the control voltage at the input of VCO 208 is based on the output of charge pump 204 as filtered by non-integrating loop filter 206, the resulting noise power of lower frequency noise in output signal OUT is thus reduced at lower frequencies, as compared with the prior art example described in FIG. 1B. Plot 324 in FIG. 3 shows the noise power spectrum of output signal OUT in example PLL 200. At lower frequencies, the folded quantization noise is integrated only a single time (by VCO 208), and thus has a −20 dB/decade shape in plot 324, as compared with the −40 dB/decade characteristic shown in plot 156 of FIG. 1B. The overall low frequency noise power is thus attenuated in this example PLL 200, as it is not amplified by an integration factor in the transfer function of non-integrating loop filter 206.

Rather than providing frequency control via an integrating term in the loop filter, frequency control and correction is instead provided in PLL 200 of FIG. 2 by frequency control circuit 220. Frequency control logic 222 has an input coupled to the output of VCO 208 to receive output signal OUT, and an input receiving reference clock REF, for example from the same source or clock generator circuit as that coupled to phase detector 202.

In a general sense, frequency control logic 222 compares the frequency $f_{OUT}$ of output signal OUT, as currently generated by VCO 208, with the frequency $f_{REF}$ of reference clock signal REF multiplied by frequency multiple value frac(N), which is the target output frequency of PLL 200 based on user input and the like. In response to this comparison, frequency control logic 222 outputs control signal U/D to an input of voltage adjustment circuit 224. In response, voltage adjustment circuit 224 applies voltage VC to an input of voltage adder 207. This voltage VC indicates a frequency adjustment to VCO 208, based on the comparison of the current output frequency $f_{OUT}$ with the target output frequency (e.g., $f_{REF}·$frac(N)).

FIG. 2 illustrates a generalized architecture of frequency control logic 222 suitable for comparing the current output frequency $f_{OUT}$ with the target output frequency of PLL 200. Frequency divider 232 has an input coupled to the output of VCO 208, and an output coupled to a data input of counter 230. In this example, frequency divider 232 generates a signal DIV by dividing down the frequency $f_{OUT}$ of output signal OUT by the larger divisor value (N+1) applied by MMD 214 in feedback circuit 210. The output of frequency divider 232, providing this signal DIV, is coupled to the data input of counter 230. Counter 230 also has a clock input receiving reference clock signal REF.

In this example, the frequency $f_{DIV}$ of signal DIV output by frequency divider 232 is lower than the frequency of reference clock signal REF, because divisor value N+1 applied by frequency divider 232 is larger (e.g., the next higher integer) than the divisor value frac(N). An expected number EXP of clock edges of signal DIV within a given number J of cycles of clock signal CLK can be determined from a given value of frac(N), assuming the frequency $f_{OUT}$ matches the target frequency frac(N)*$f_{REF}$ over those J cycles. This expected number EXP of edges of signal DIV per J cycles may be stored in frequency control logic 222, or frequency control logic 222 may calculate expected number EXP based on the value of frac(N) stored in register 216.

In any case, comparator 240 receives expected number EXP at one input, and receives an output value of counter 230 at another input. Comparator 240 compares the contents of counter 230 with expected number EXP, after J cycles of reference clock signal REF have elapsed, and outputs signal U/D to voltage adjustment circuit 224 according to the result of that comparison.

Voltage adjustment circuit 224 in this example provides a variable voltage VC to an input of voltage adder 207 in response to signal U/D from frequency control logic 222. Voltage adder 207 adds this voltage VC with the voltage at the output of non-integrating loop filter 206, and applies the summed voltage to the input of VCO 208. VCO 208 adjusts the frequency of its output signal OUT accordingly. In this example, the voltage adjustment (e.g., voltage VC) provided by frequency control circuit 220 replaces the frequency adjustment provided by the integration (1/s) in the transfer function of integrating loop filter 120 in prior art PLL 100 of FIG. 1A.

Figure 4:
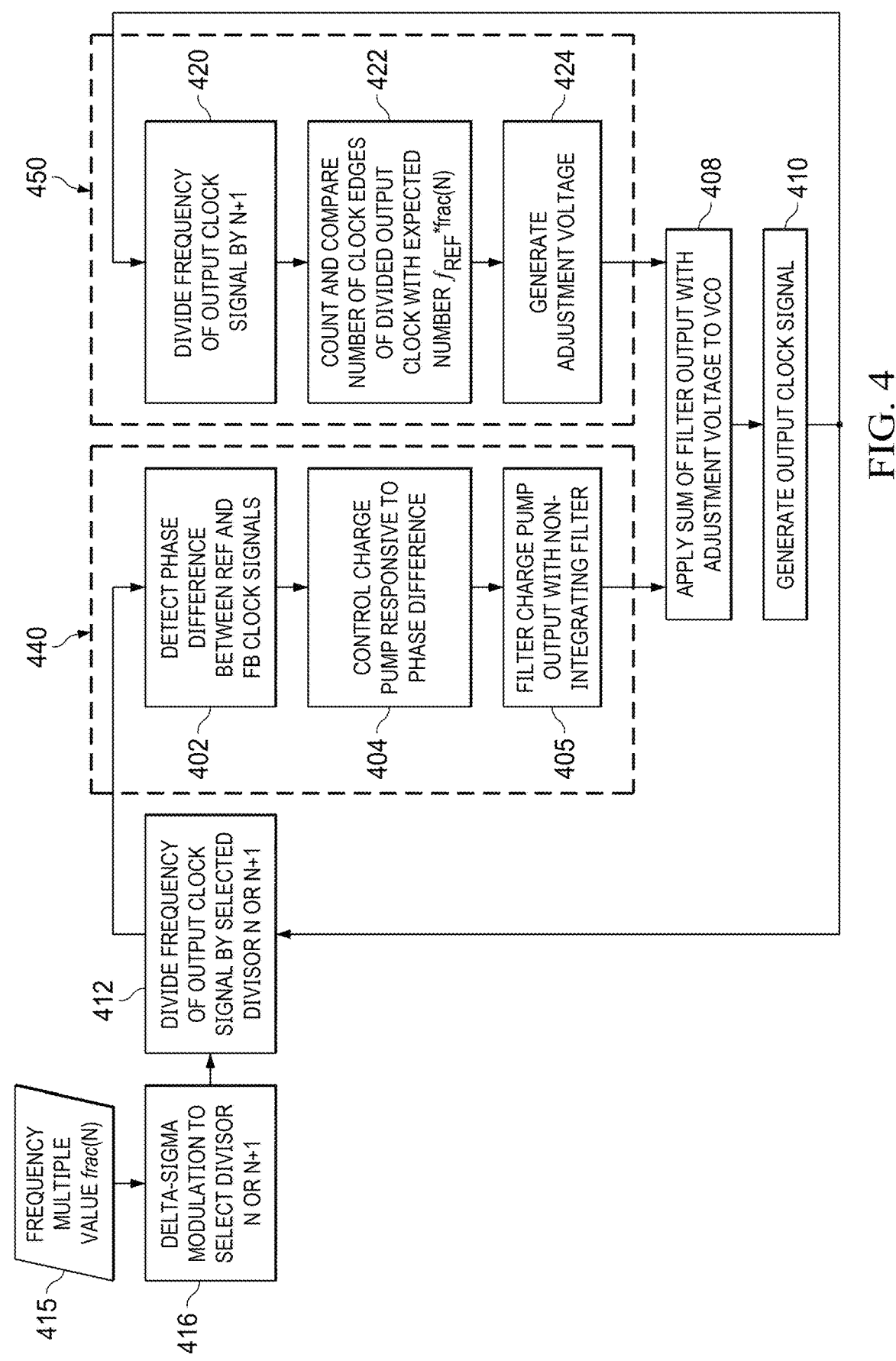
FIG. 4 is a flow diagram illustrating the operation of example PLL of FIG. 2.

FIG. 4 describes an example method of operating a PLL, such as fractional PLL 200, to generate an output clock signal OUT based on a reference clock signal REF. This example method is performed synchronously in a loop, for example with each cycle of the reference clock signal REF. More particularly, the example method of FIG. 4 includes main sub-loop 440 and frequency control sub-loop 450 operating in parallel. Main sub-loop 440 includes process blocks 402, 404, 405, and frequency control sub-loop 450 includes process blocks 420, 422, 424.

In process block 402 of main sub-loop 440, a phase difference is detected between an edge of reference clock signal REF and that of a feedback signal FB. In PLL 200 of FIG. 2, process block 402 is performed by phase detector 202. In process block 404, a charge pump (e.g., charge pump 204 in FIG. 2) is controlled in response to the detected phase difference to output a signal (e.g., a current or voltage) to a non-integrating loop filter. As described above in connection with loop filter 206 of FIG. 2, this loop filter is non-integrating in the sense that it does not include an integrating factor 1/s in its transfer function, as would be provided by a capacitor coupled between the filter input and circuit ground. Filtering of the signal from the output with this non-integrating transfer function is performed in process block 405 to produce a filtered signal (e.g., a voltage).

The filtered signal from process block 405 is added to an adjustment voltage generated by frequency control sub-loop 450 (described below) to produce a summed voltage that is applied to an input of a voltage controlled oscillator (VCO) in process block 408. An output clock signal is generated by that VCO in process block 410 and forwarded to down-stream circuit functions.

The output clock signal generated by the VCO of the PLL in process block 410 is divided down in frequency to produce a feedback signal in process block 412. More particularly, in a fractional PLL such as PLL 200 of FIG. 2, process block 412 divides down the frequency of the output clock signal by one of two integer divisor values N and N+1. These integer divisor values N and N+1 are the integer values below and above, respectively, a frequency multiple value frac(N) (input 415 in FIG. 4) indicating the target frequency multiple of the output clock signal relative to the reference clock signal. Selection between the integer divisor values N and N+1 to be applied in process block 412 is made in this example method by delta-sigma modulation based on frequency multiple value frac(N), and is performed in process block 416. The divided down output signal from process block 412 is used in the next instance of phase difference detection process block 402 in the next cycle.

As noted above, frequency control sub-loop 450 generates an adjustment voltage in response to a comparison of a frequency of the output clock signal with a product of the frequency of the reference clock signal and the frequency multiple value frac(N). In the example of FIG. 4, process block 420 divides down the frequency of the output clock signal generated by the VCO in process block 410 by the larger integer divisor value N+1 applied in process block 412. In process block 422, the number of clock edges of the divided clock signal from process block 410 that occur within a selected number J of cycles of the reference clock signal is counted, and compared with an expected number EXP that is based on the target output frequency of the PLL (e.g., frac(N)*$f_{REF}$, where $f_{REF}$ is the frequency of the reference clock signal). An adjustment voltage is generated in process block 424 in response to whether the number of clock edges of the divided clock signal from process block 410 is below, exceeds, or matches the expected number EXP.

Figure 5A:
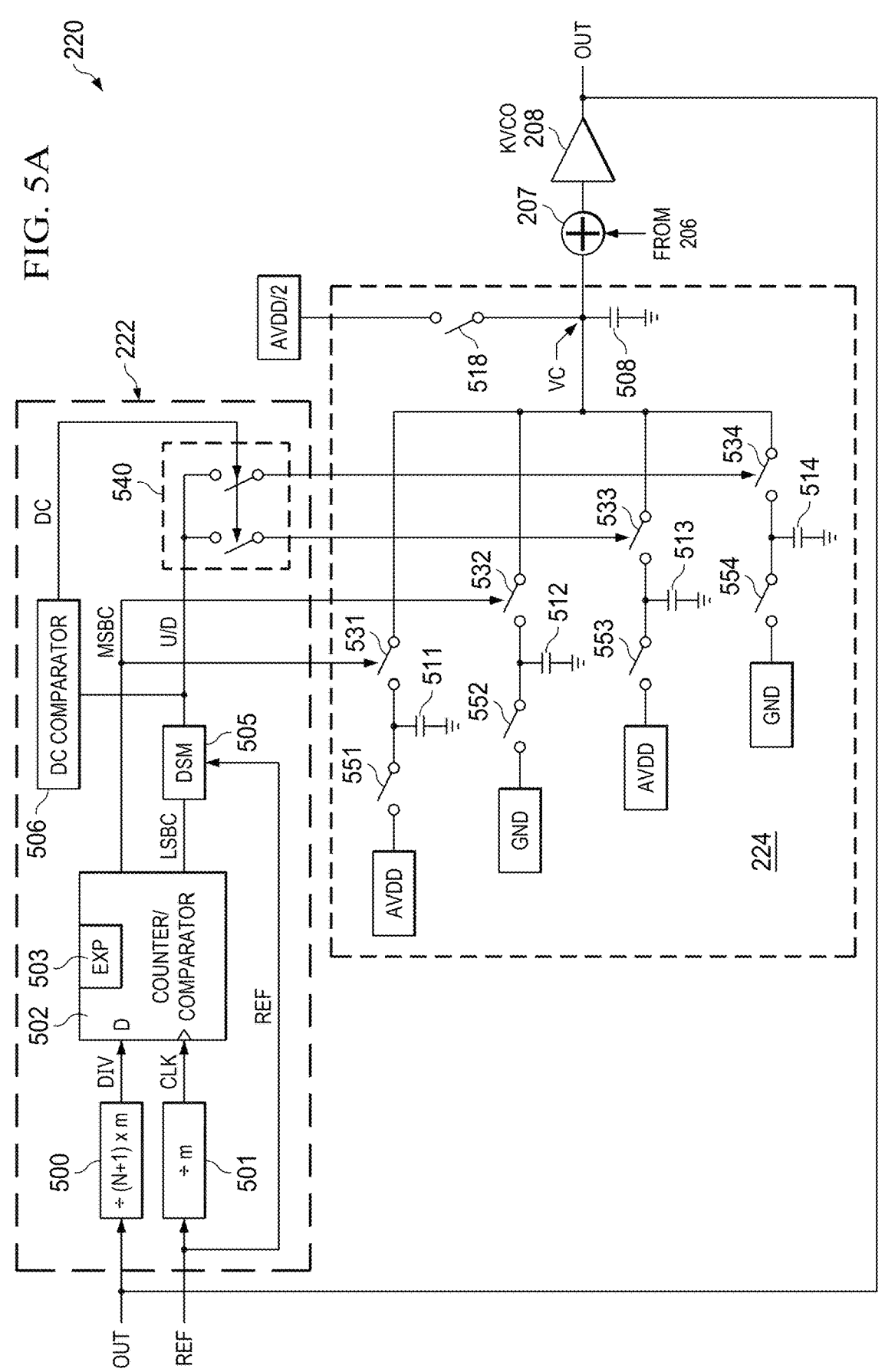
FIG. 5A is an electrical diagram, in block and schematic form, of example frequency control circuitry in the PLL of FIG. 2.
Figure 5B:
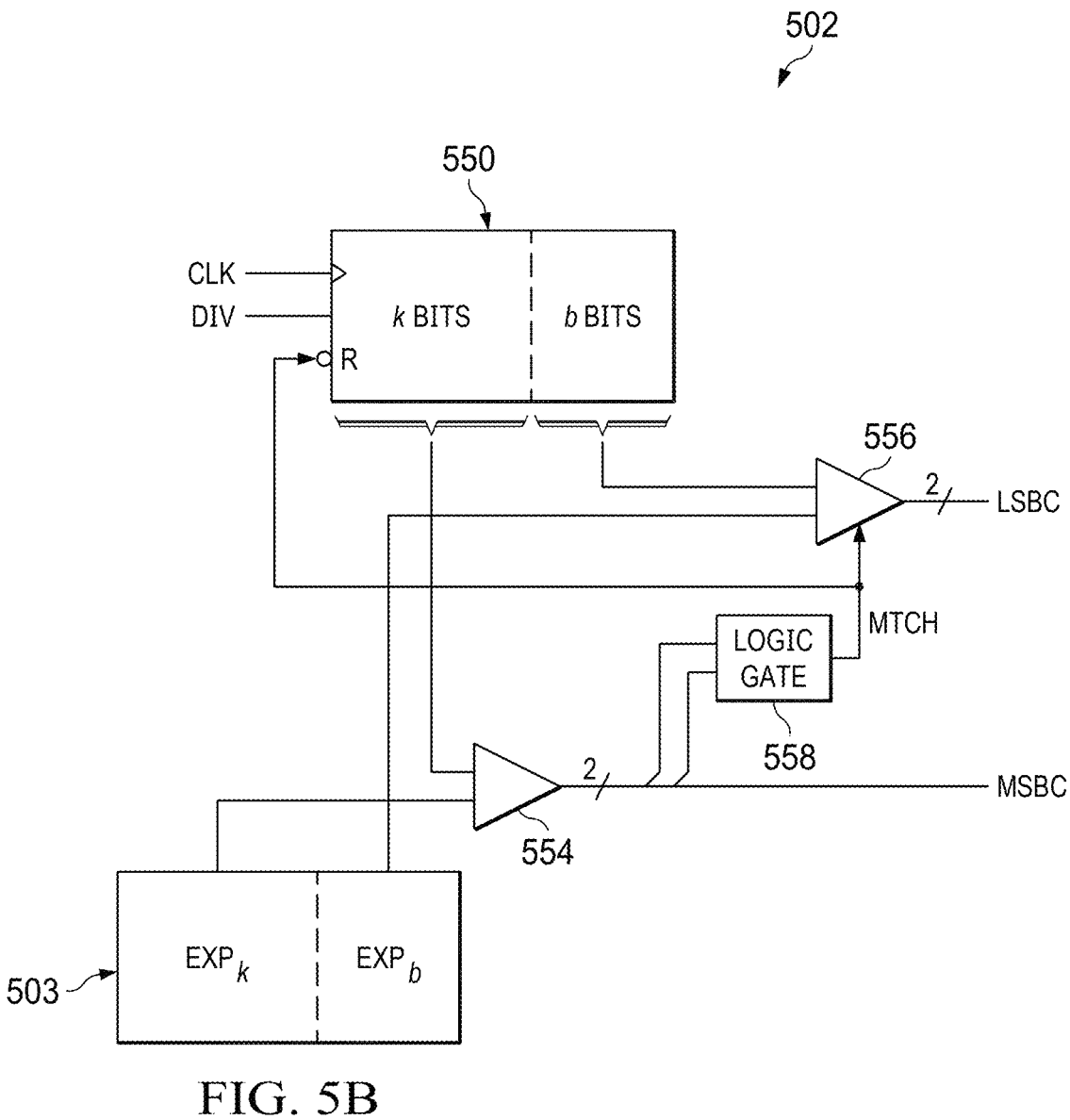
FIG. 5B is an electrical diagram, in block form, of an example counter/comparator in the frequency control circuitry of FIG. 5A.

FIGS. 5A and 5B illustrate, in further detail, an example of frequency control circuit 220, including frequency control logic 222 and voltage adjustment circuit 224. FIG. 5A shows frequency control circuit 220 in combination with voltage adder 207 and VCO 208. Frequency control logic 222 in this example includes frequency dividers 500 and 501, counter/comparator 502, delta-sigma modulator (DSM) 505, duty cycle comparator 506, and gating circuit 540. Counter/comparator 502 includes a memory location 503. Counter/comparator 502 corresponds to counter 230 and comparator 240 of FIG. 2, and is shown in further detail in FIG. 5B, described below. Voltage adjustment circuit 224 includes capacitors 508, 511, 512, 513, and 514; and switches 518, 531, 532, 533, 534, 541, 542, 543, and 544. Switches 518, 531, 532, 533, 534, 541, 542, 543, and 544 may each be constructed as pass transistors, or pass gates (e.g., complementary MOS transistors with source/drain paths in parallel), and having a control terminal (e.g., gate).

In this example, frequency divider 500 in frequency control logic 222 has an input coupled to the output of VCO 208, to receive output signal OUT, and an output coupled to a data input of counter/comparator 502. Frequency divider 500 outputs a signal DIV at a frequency $f_{DIV}$ divided down from the frequency $f_{OUT}$ of output signal OUT by the product of the larger divisor value (N+1) applied by MMD 214 and an integer value m. Frequency divider 501 in this example of frequency control logic 222 has an input receiving reference clock signal REF, and an output coupled to a clock input of counter/comparator 502. Frequency divider 501 outputs a clock signal CLK to counter/comparator 502 at a frequency divided down from the frequency $f_{REF}$ of reference clock signal REF by the same integer value m as applied with larger divisor value (N+1) by frequency divider 500.

The integer value m applied by frequency dividers 500 and 501 is selected to reduce the clock frequency requirements of digital circuitry in frequency control logic 222. Optionally, if frequency control logic 222 can operate without this additional frequency division by m, frequency divider 501 may be omitted, in which case frequency divider 500 divides down the frequency $f_{OUT}$ of output signal OUT only by the larger divisor value (N+1) to generate signal DIV. The generalized architecture described above in connection with FIG. 2 corresponds to this optional case in which frequency divider 501 is omitted (e.g., m=1).

More particularly, the frequency $f_{CLK}$ of clock signal CLK output by frequency divider 501 is $f_{REF} \div m$ (m≥0), while the frequency $f_{DIV}$ of signal DIV output by frequency divider 500 is $f_{OUT} \div [m*(N+1)]$. In frequency lock, output frequency $f_{OUT}$ is frac(N)*$f_{REF}$, on average, so that frequency $f_{DIV}$ may be expressed as:

$$f_{DIV} = \frac{f_{REF} \cdot frac(N)}{m \cdot (N + 1)} \qquad (5)$$

Because divisor value N+1 applied by frequency divider 500 is larger than the frequency multiple value frac(N), this frequency forv is necessarily lower than frequency $f_{CLK}$=$f_{REF}$÷m. For a given value of frac(N), one can determine an expected number of edges of signal DIV within a given number J of cycles of clock signal CLK if the frequency $f_{OUT}$ of output signal OUT is at the desired value frac(N)*$f_{REF}$ over those J cycles. This expected number EXP of edges of signal DIV per J cycles is stored in memory location 503 of counter/comparator 502. Memory location 503 may be programmed with expected number EXP, or counter/comparator 502 or other logic circuitry (e.g., within frequency control logic 222) may calculate expected number EXP from the contents of register 216.

In operation, counter/comparator 502 counts the number of edges of signal DIV that occur in a selected number J of cycles of clock signal CLK, and outputs control signals MSBC and LSBC in response to comparisons of that count with an expected number EXP of those clock edges stored in memory location 503. In this example, as further described below, counter/comparator 502 can count the number of edges of signal DIV that occur in a selected number J=$2^{k+b}$ of cycles of clock signal CLK, storing this count as a digital value with k most significant bit (MSB) positions and b least significant bit (LSB) positions. Control signals MSBC indicate the result of the comparison of the number of edges of signal DIV to the expected number EXP over J=$2^k$ cycles of clock signal CLK (e.g., k MSBs), and control signals LSBC indicate the result of the comparison for the b LSBs. Counter/comparator 502 communicates control signals MSBC to voltage adjustment circuit 224, and communicates control signals LSBC to DSM 505. DSM 505 has an output coupled to an input of duty cycle comparator 506, and to an input of gating circuit 540. Gating circuit 540 has an output coupled to voltage adjustment circuit 224, as described in further detail below.

FIG. 5B illustrates an example functional architecture of counter/comparator 502. Counter/comparator 502 includes k+b bit counter 550, k+b bit memory location 503, comparators 554 and 556, and logic gate 558.

Counter 550 has a clock input receiving clock signal CLK from frequency divider 501, and a data input receiving signal DIV from frequency divider 500. In this example, counter 550 also has a (negative logic) reset input coupled to an output of logic gate 558. Counter 550 has a k-bit output, corresponding to its k MSBs, coupled to an input of comparator 556. Counter 550 also has a b-bit output, corresponding to its b LSBs, coupled to an input of comparator 556. Counter 550 stores a count of the number of edges of signal DIV occurring in a selected number J=$2^{k+b}$ of cycles of clock signal CLK following reset, stores this count as a digital value in k MSB positions and b LSB positions.

In this example, memory location 503 stores expected number EXP as a k+b bit value, corresponding to the expected number of edges of signal DIV received over J=2k+b cycles of clock signal CLK. Comparator 554 has a second input receiving a value EXP representing the k MSBs of expected count EXP from memory location 503, and has an output providing control signals MSBC in response to a comparison of the k MSBs of the expected count EXP with the k MSBs of the contents of counter 550. Control signals MSBC are forwarded to voltage adjustment circuit 224 as shown in FIG. 5A. The output(s) of comparator 554 are also coupled to inputs of logic function 558, which performs a logic operation on the control signals MSBC issued by comparator 554 and issues an enable signal MTCH responsive to the result of that logic operation. Logic function 558 may be a logic gate such as a NAND, NOR, AND, OR, or XOR, or some combination thereof, depending on the logic levels of the signals at its inputs and its output.

Comparator 556 has a second input receiving a value $EXP_b$ representing the b LSBs of expected count EXP from memory location 503, and an enable input coupled to an output of logic function 558. Comparator 556 has an output providing, when enabled, control signals LSBC in response to a comparison of the b LSBs $EXP_b$ of the expected count and the b LSBs of the contents of counter 550. Control signals LSBC are forwarded to DSM 505 as shown in FIG. 5A.

DSM 505 has an output coupled to gating circuit 540 and to an input of duty cycle comparator 506. DSM 505 performs a delta-sigma modulation based on control signals LSBC with each cycle of reference clock CLK, and outputs modulated signal U/D in response.

Gating circuit 540 forwards signal U/D from DSM 505 to voltage adjustment circuit 224 in response to control signal DC received from an output of duty cycle comparator 506. In this example, gating circuit 540 includes two switches, which may be constructed as pass transistors with gates coupled to the output of duty cycle comparator 506. In this example, duty cycle comparator 506 opens gating circuit 540 in response to the duty cycle of signal U/D from DSM 505 having a duty cycle at or about 50% (e.g., 50%±Δ).

In example voltage adjustment circuit 224 of FIG. 5A, main capacitor 508 has one terminal coupled to the VC input of voltage adder 207 (node VC), and a second terminal coupled to a common potential (e.g., circuit ground). Switch 518 has one terminal coupled to the VC input of voltage adder 207 and a second terminal receiving a selected voltage, which in this example is one-half the power supply voltage AVDD (e.g., AVDD/2).

Capacitor 511 has a terminal coupled to circuit ground, and another terminal coupled to a terminal of each of switches 531 and 551. Switch 531 has another terminal coupled to node VC, and switch 551 has another terminal receiving power supply voltage AVDD. Capacitor 512 has a terminal coupled to circuit ground, and another terminal coupled to a terminal of each of switches 532 and 552. Switch 532 has another terminal coupled to node VC, and switch 552 has another terminal coupled to circuit ground. Switches 531 and 532 have control terminals coupled to the output of counter/comparator 502. For example, switch 531 may be controlled by the MSB and switch 532 by the LSB of control signals MSBC. In this example, capacitors 511 and 512 provide a coarse adjustment of voltage VC in response to control signals MSBC. Capacitors 511 and 512 may have the same capacitance as one another.

Capacitor 513 has a terminal coupled to circuit ground, and another terminal coupled to a terminal of each of switches 533 and 553. Switch 533 has another terminal coupled to node VC, and switch 553 has another terminal receiving power supply voltage AVDD. Capacitor 514 has a terminal coupled to circuit ground, and another terminal coupled to a terminal of each of switches 534 and 554. Switch 534 has another terminal coupled to node VC, and switch 554 has another terminal coupled to circuit ground.

Switches 533 and 534 have control terminals coupled to the output of DSM 505 via gating circuit 540. For example, switch 533 may be controlled by the MSB and switch 534 by the LSB of control signals U/D. In this example, capacitors 513 and 514 provide a finer adjustment of voltage VC than capacitors 511 and 512. Capacitors 513 and 514 may have the same capacitance as one another, and smaller capacitances than that of capacitors 511 and 512.

Switches 551, 552, 553, 555 and 518 are controlled by timing circuitry (not shown) provided in frequency control circuitry 220 or elsewhere in or associated with PLL 200 to operate in the manner described below in connection with FIGS. 6A through 6H.

Figure 6A:
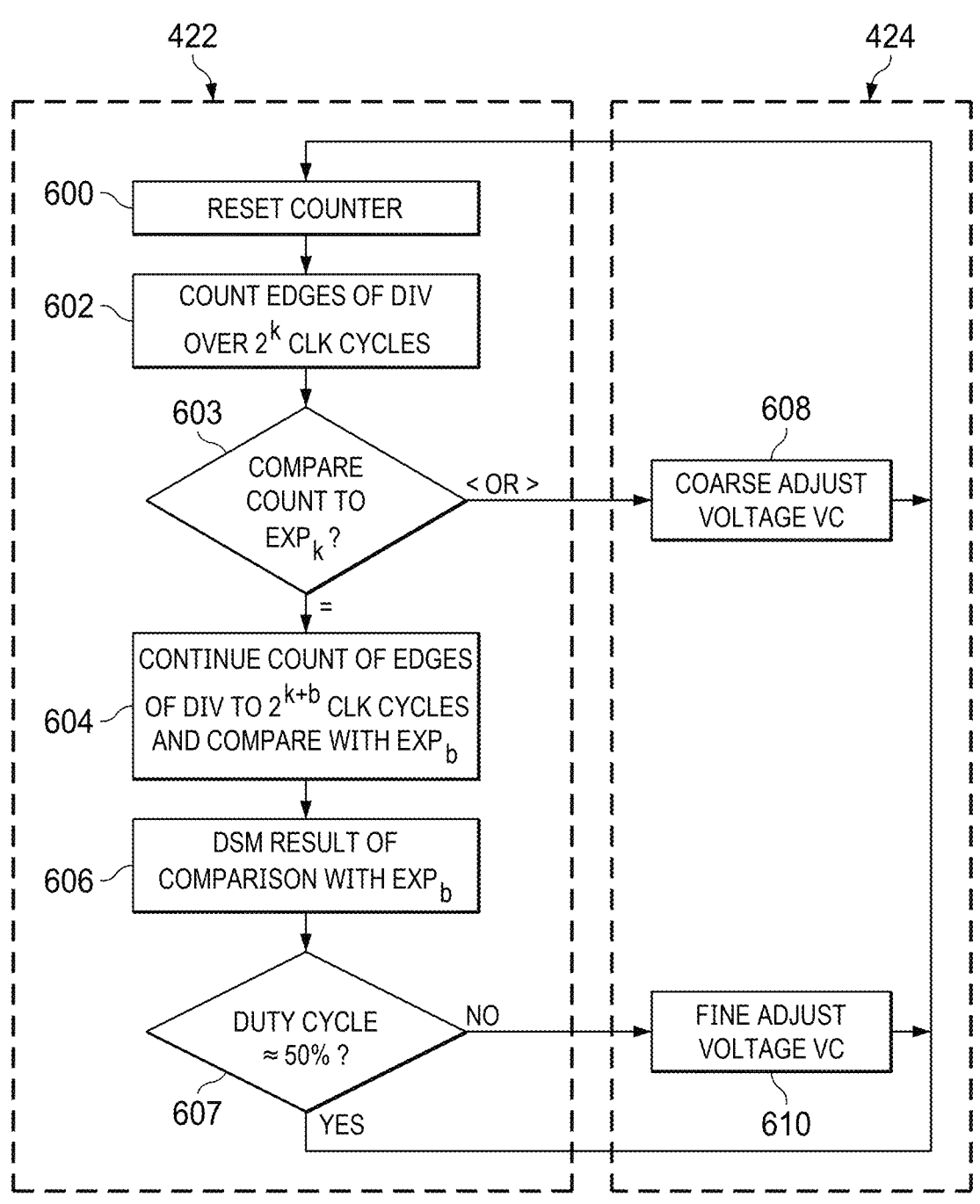
FIG. 6A is a flow diagram illustrating the operation of the example PLL of FIG. 2 including the example frequency control circuitry of FIG. 5A.

FIG. 6A is a flow chart illustrating an example of the operation of frequency control logic 222 and voltage adjustment circuit 224 of FIGS. 5A and 5B, in performing process blocks 422 and 424 in the method of FIG. 4. As described above in connection with FIG. 4, output clock signal OUT is divided down in frequency by larger divisor N+1 in process block 420. In this example, process block 420 corresponds to frequency divider 500 dividing down the output clock signal by larger divisor N+1 multiplied by factor m to produce signal DIV, and frequency divider 501 dividing down reference clock signal CLK by the factor m to produce clock signal CLK.

In process block 600 of FIG. 6A, counter 550 is reset (e.g., to zero). In process block 602, counter 550 advances or maintains its contents in response to the logic level of signal DIV at its data input when clocked by each cycle of clock signal CLK. After $2k$ cycles of clock signal CLK have elapsed, decision 603 is performed by comparator 554 comparing the value stored in the k MSBs of counter 550 with the k MSBs of the expected number EXP stored in memory location 503. If the value in the k MSBs of counter 550 does not match the MSB portion EXPx of the expected number (decision 603 returns either a "greater than" or "less than" result), a coarse adjustment of voltage VC is made by voltage adjustment circuit 224 in process block 608.

Figure 6B:
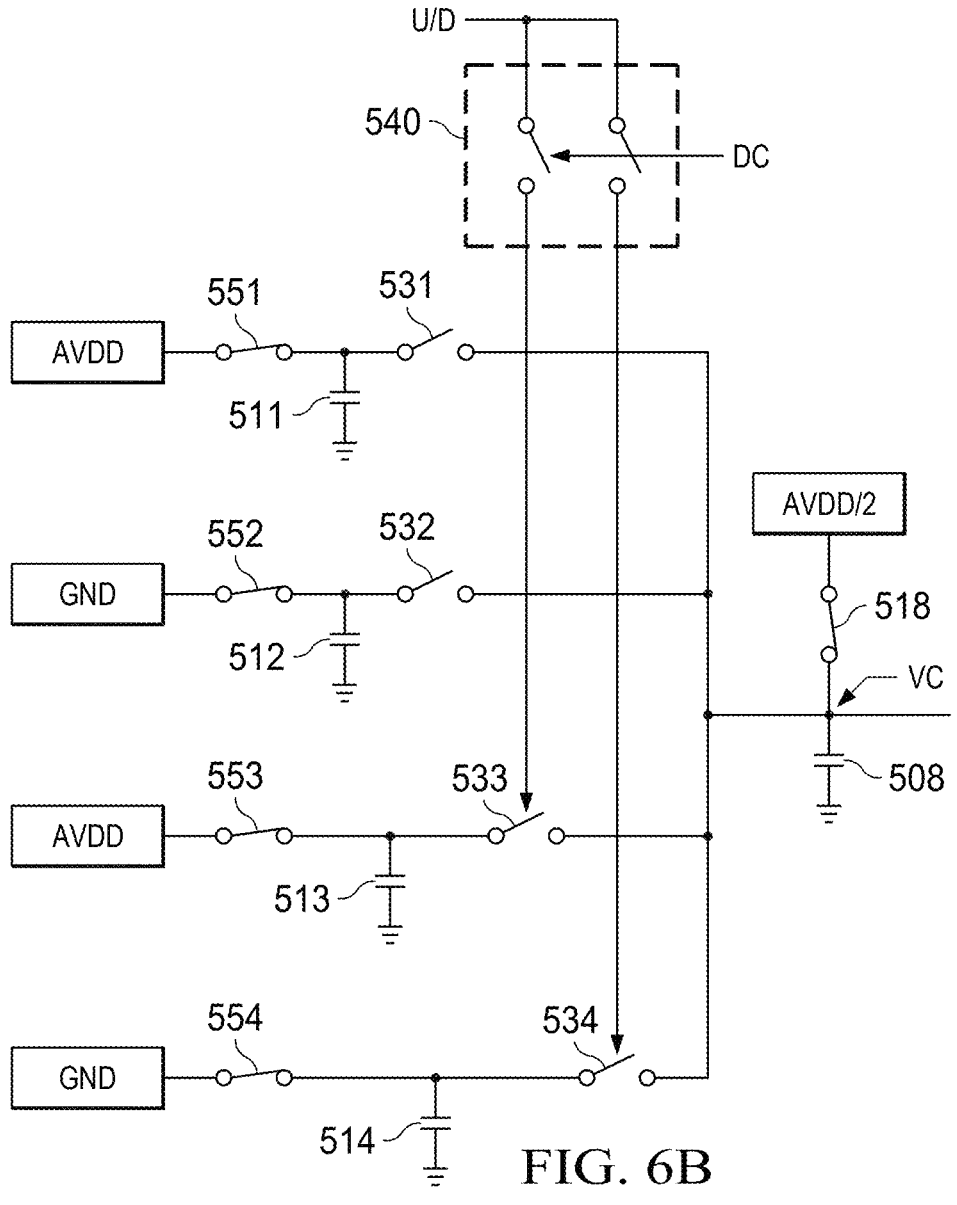
FIGS. 6B through 6H are electrical diagrams, in schematic form, illustrating an example of the operation of voltage adjustment circuitry in the frequency control circuitry of FIG. 5A.
Figure 6C:
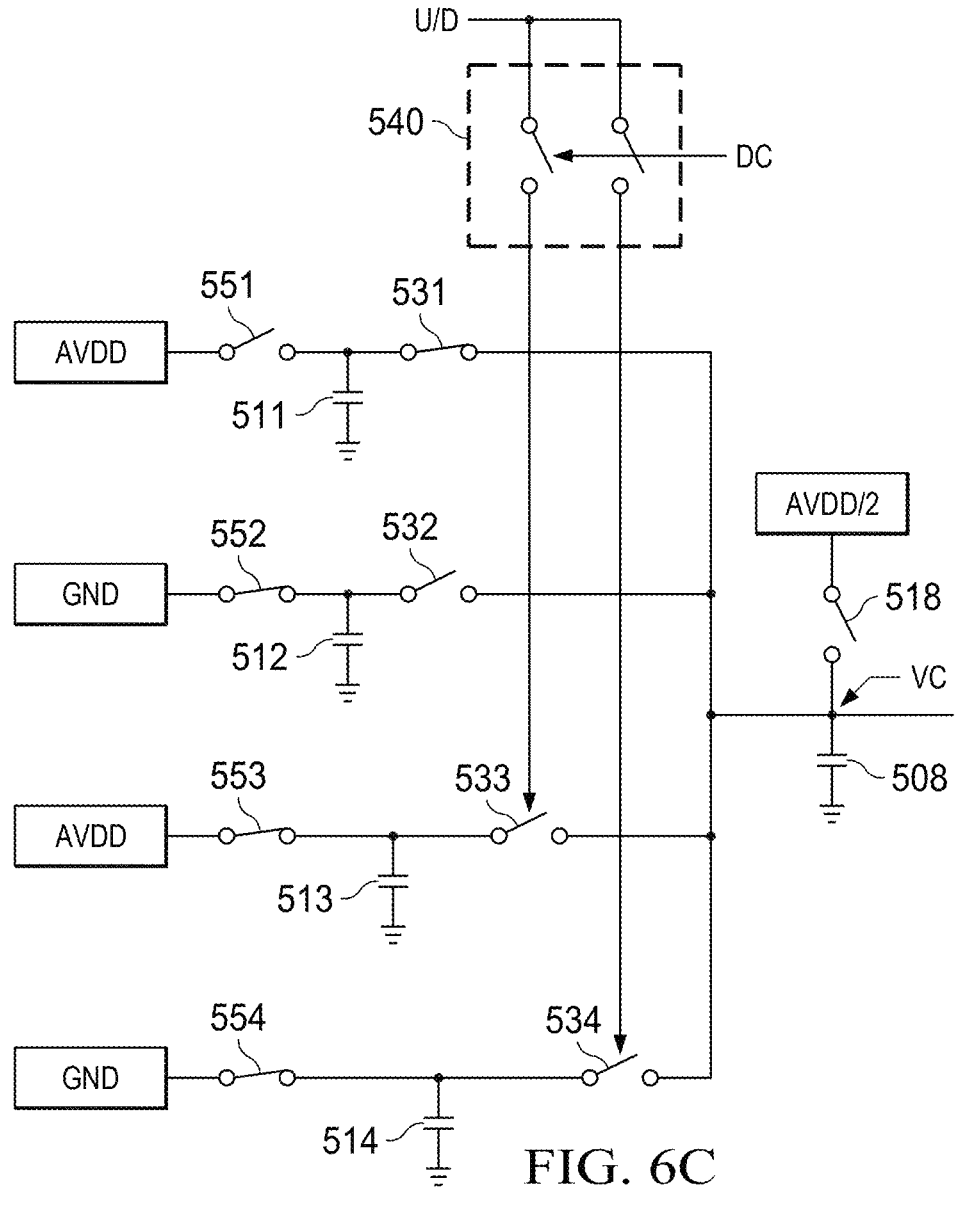
Figure 6D:
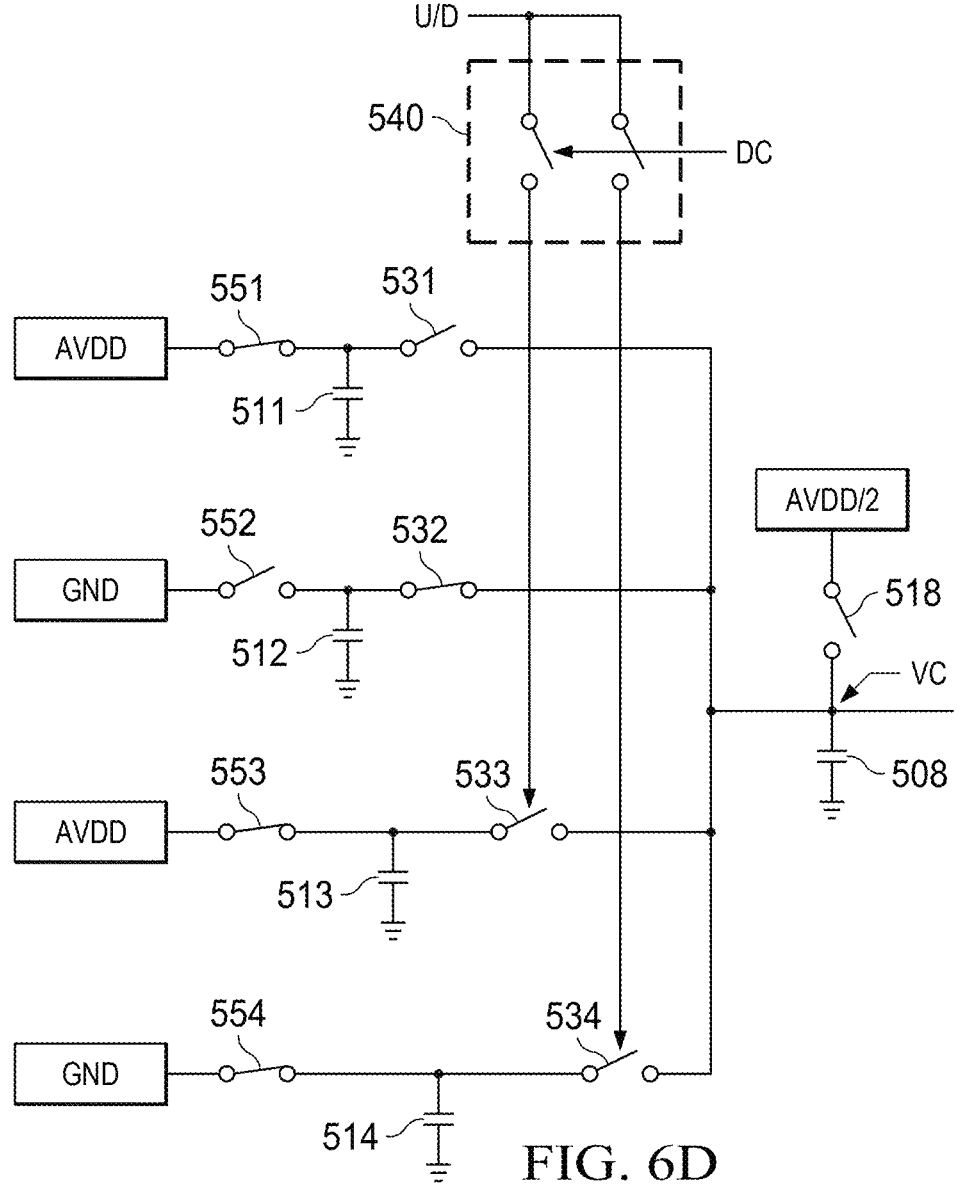

FIGS. 6B through 6D illustrate the states of voltage adjustment circuit 224 in performing a coarse adjustment of voltage VC in process block 608. FIG. 6B shows the state of voltage adjustment circuit 224 prior to, or at the beginning of, an instance of process block 608. In this initial state, switch 518 is closed to charge capacitor 508 at node VC to an initial voltage, for example the voltage AVDD/2 as shown in FIG. 6B. Switches 551 and 552 are also closed, charging (or discharging) capacitors 511 and 512 to power supply voltage AVDD and circuit ground, respectively. Switches 553 and 554 may also be closed, similarly charging (or discharging) capacitors 513 and 514 to power supply voltage AVDD and circuit ground, respectively. Switches 531, 532, 533, and 534 are all held open at this time, isolating capacitors 511, 512, 513, 514 from node VC.

FIG. 6C shows the state of voltage adjustment circuit 224 in coarse adjustment process block 608 to adjust the voltage VC higher, for example in response to decision 603 determining that the number of edges of signal DIV over $2^k$ cycles is less than the k bit expected number EXPR. This comparison result indicates that the frequency $f_{OUT}$ of output clock signal OUT is below the target frequency. In this case, as shown in FIG. 6C, switch 518 is open, switch 531 is closed, and switch 551 is open. Meanwhile, switches 532, 533, and 534 remain open, isolating their corresponding capacitors 512, 513, 514 from node VC. Switches 552, 553, and 554 may remain closed or may be opened. Because capacitor 511 was initially charged to voltage AVDD (FIG. 6B), the coupling of capacitor 511 to node VC via closed switch 531 raises the voltage at node VC from its initial voltage of AVDD/2. The specific amount of this voltage increase depends on the relationship of the capacitances 508 and 511. In any event, the voltage at node VC and applied to voltage adder 207 is increased in this instance of process block 608, incrementally increasing the frequency $f_{OUT}$ of output clock signal OUT as generated by VCO 208.

FIG. 6D shows the state of voltage adjustment circuit 224 in coarse adjustment process block 608 to adjust the voltage VC lower, for example in response to decision 603 determining that the number of edges of signal DIV over $2^k$ cycles is greater than the k bit expected number EXPR. This comparison result indicates that the frequency $f_{OUT}$ of output clock signal OUT is above the target frequency. In this case, as shown in FIG. 6C, switch 518 is open, switch 532 is closed, and switch 552 is open. Meanwhile, switches 531, 533, and 534 remain open, isolating their corresponding capacitors 511, 513, 514 from node VC. Switches 551, 553, and 554 may remain closed or may be opened. Because capacitor 512 was initially discharged to ground (FIG. 6B), the coupling of capacitor 512 to node VC via closed switch 532 reduces the voltage at node VC from its initial voltage of AVDD/2. The specific amount of this voltage increase depends on the relationship of the capacitances 508 and 512. In any event, the voltage at node VC and applied to voltage adder 207 is decreased in this instance of process block 608, incrementally decreasing the frequency $f_{OUT}$ of output clock signal OUT as generated by VCO 208.

Following the coarse adjustment of process block 608 in FIG. 6A, counter 550 is reset in process block 600, for example in response to logic function 558 indicating a non-match condition to the reset input of counter 550 (FIG. 5A). The process is then repeated from process block 602.

In response to decision 603 indicating that the value in the k MSBs of counter 550 matches the MSB portion EXPx of the expected number (decision 603 returns an "equals" result), process block 604 is performed to continue counting edges of signal DIV up to $2^{k+b}$ cycles of clock signal CLK, without resetting counter 550. Logic function 558 (FIG. 5B) issues an enable signal MTCH in response to the "equals" result of decision 603, enabling comparator 556 in counter/comparator 402. Also in process block 604, and in response to $2^{k+b}$ cycles of clock signal CLK having elapsed, comparator 556 compares the value stored in the b LSBs of counter 550 with the b LSBs of the expected number EXP stored in memory location 503.

The results of this comparison as output by comparator 556 are forwarded to DSM 505, which performs a delta-sigma modulation of those results in process block 606, producing a 1-bit output (e.g., +1, −1) accordingly. In decision 607, duty cycle comparator 506 determines whether the duty cycle of the output signal from DSM 506 is at or near 50%. A 50% duty cycle in the output signal from DSM 505 would indicate that the output frequency $f_{OUT}$ is very close to the target output frequency. For example, decision 607 can determine whether the duty cycle of the DSM output is within a range of 50%±Δ, where Δ is an estimate of the desired accuracy to which PLL 200 is to operate.

If the duty cycle of the output signal from DSM 505 is outside of the range of 50%±Δ (e.g., decision 607 returns a "no" result), a fine adjustment of voltage VC is made by voltage adjustment circuit 224 in process block 610.

Figure 6E:
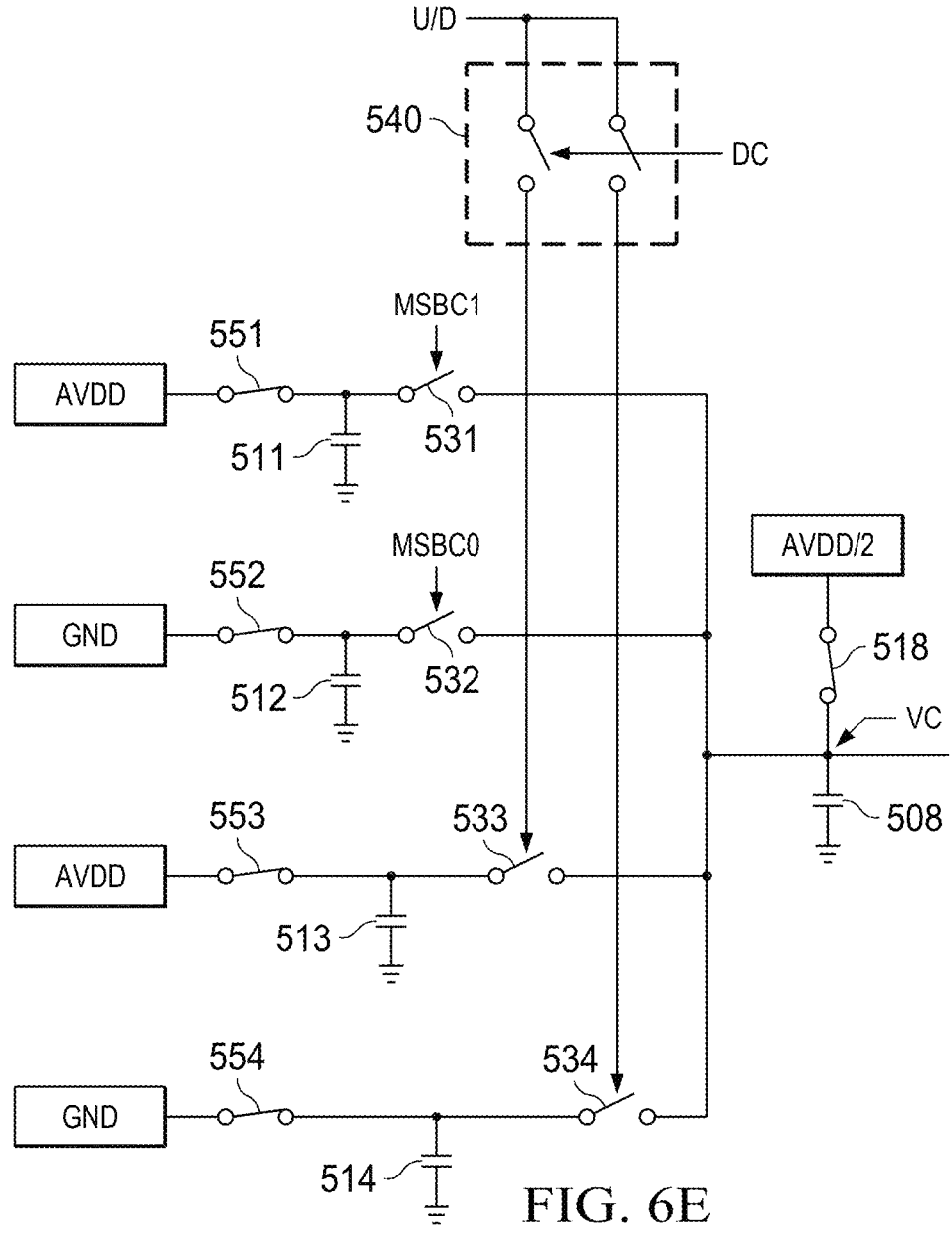
Figure 6F:
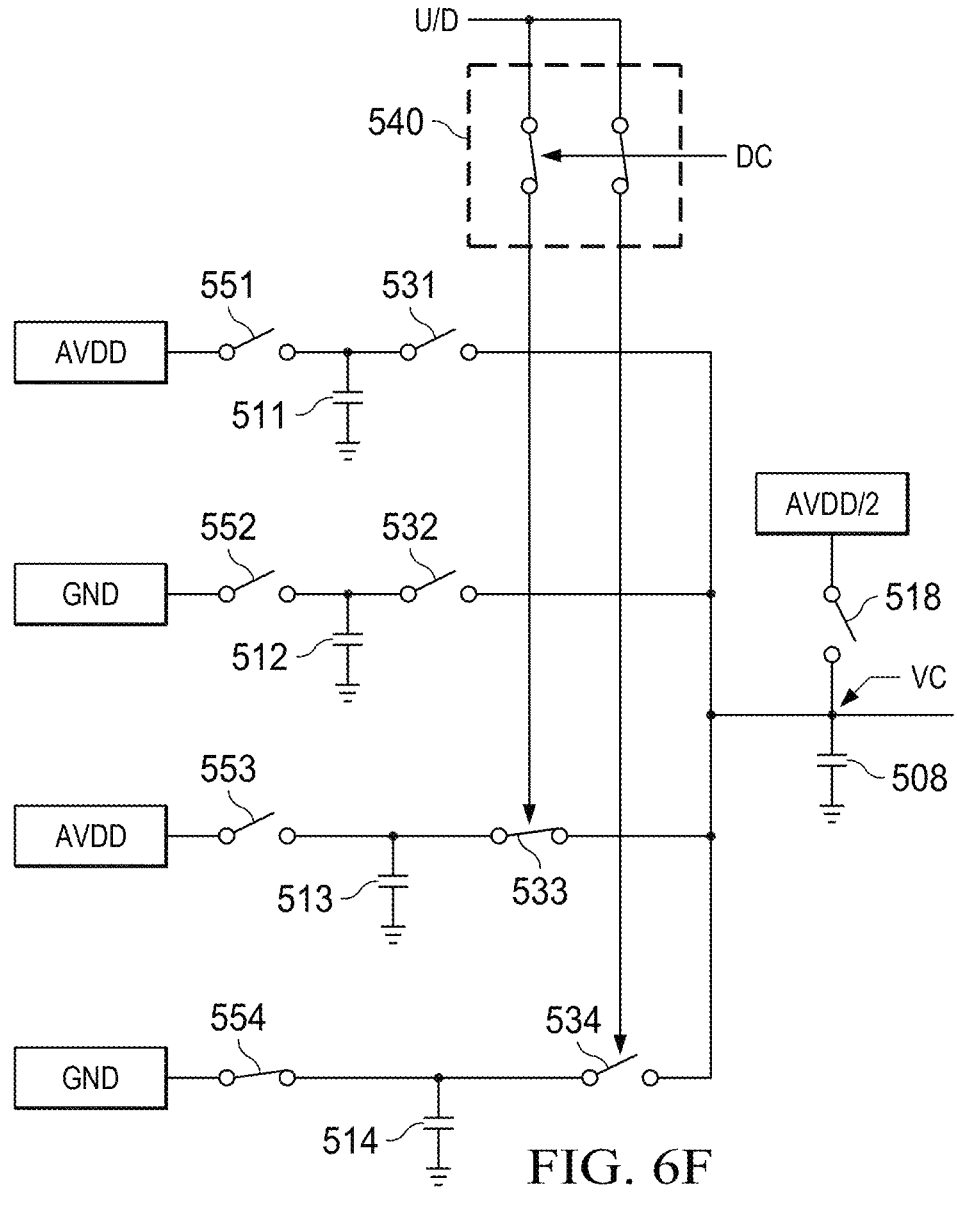
Figure 6G:
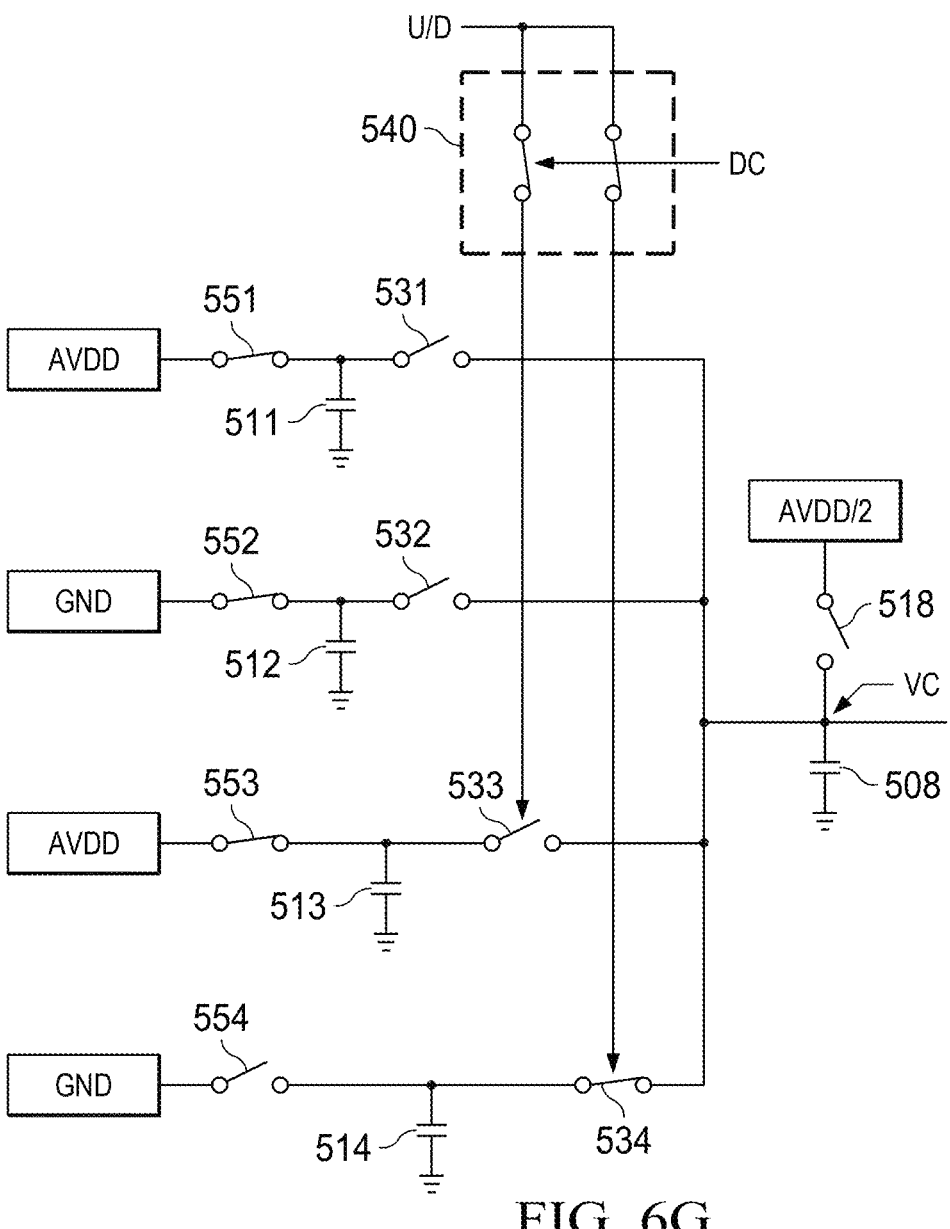

FIGS. 6E through 6G illustrate the states of voltage adjustment circuit 224 in performing a fine adjustment of voltage VC in process block 610. FIG. 6E shows the state of voltage adjustment circuit 224 prior to, or at the beginning of, an instance of process block 610. In this initial state, similarly as that shown in FIG. 6B for the coarse adjustment process, switch 518 is closed to charge capacitor 508 at node VC to the initial voltage AVDD/2. Switches 553 and 554 are also closed, charging (or discharging) capacitors 513 and 514 to power supply voltage AVDD and circuit ground, respectively. Switches 551 and 552 may also be closed, similarly charging (or discharging) capacitors 511 and 512 to power supply voltage AVDD and circuit ground, respectively. Switches 531, 532, 533, and 534 are all held open at this time, isolating capacitors 511, 512, 513, 514 from node VC.

FIG. 6F shows the state of voltage adjustment circuit 224 in fine adjustment process block 610 to adjust the voltage VC higher, for example in response to comparator 556 determining that the number of edges of signal DIV over $2^b$ cycles is less than the b bit expected number $EXP_b$, due to the output frequency $f_{OUT}$ being below the target frequency. As a result of decision 607 determining that duty cycle of the output signal from DSM 505 is outside of the range of $50\%\pm\Delta$, duty cycle comparator 506 issues a control signal DC to gating circuit 540 that causes its switches to be closed. The state of control signals U/D from DSM 505 (FIG. 5B) are thus enabled to adjust the voltage at node VC in response to the result of process block 606. To adjust the voltage VC higher in this instance of process block 610, switch 518 is open, switch 533 is closed, and switch 553 is open. Meanwhile, switches 531, 532, and 534 remain open, isolating their corresponding capacitors 511, 512, and 514 from node VC. Switches 551, 552, and 554 may remain closed or may be opened. Because capacitor 513 was initially charged to voltage AVDD (FIG. 6E), the coupling of capacitor 513 to node VC via closed switch 533 raises the voltage at node VC from its initial voltage of AVDD/2. The specific amount of this voltage increase depends on the relationship of the capacitances 508 and 513, as before. Because the capacitance of capacitor 513 is less than that of capacitor 511, for example, the amount of the adjustment in fine adjustment process block 610 is less than that of the coarse adjustment in process block 603. The voltage at node VC and applied to voltage adder 207 is increased in this instance of process block 610, incrementally increasing (by a smaller amount than in process block 608) the frequency $f_{OUT}$ of output clock signal OUT as generated by VCO 208.

FIG. 6G shows the state of voltage adjustment circuit 224 in fine adjustment process block 610 to adjust the voltage VC lower, for example in response to comparator 556 determining that the number of edges of signal DIV over $2^b$ cycles is greater than the b bit expected number $EXP_b$, due to the output frequency $f_{OUT}$ being higher than the target frequency. Again, because decision 607 determines that duty cycle of the output signal from DSM 505 is outside of the range of $50\%\pm\Delta$, the switches of gating circuit 540 are closed, enabling control signals U/D from DSM 505 to adjust the voltage at node VC in response to the result of process block 606. To adjust the voltage VC lower in this instance of process block 610, switch 518 is open, switch 534 is closed, and switch 554 is open. Meanwhile, switches 531, 532, and 533 remain open, isolating their corresponding capacitors 511, 512, and 513 from node VC. Switches 551, 552, and 553 may remain closed or may be opened. Because capacitor 514 was initially charged to ground (FIG. 6E), the coupling of capacitor 513 to node VC via closed switch 534 lowers the voltage at node VC from its initial voltage of AVDD/2. Again, because the capacitance of capacitor 514 is less than that of capacitor 512, for example, the amount of the adjustment in fine adjustment process block 610 is less than that of the coarse adjustment in process 603. The voltage at node VC and applied to voltage adder 207 is decreased in this instance of process block 610, incrementally decreasing (by a smaller amount than in process block 608) the frequency $f_{OUT}$ of output clock signal OUT as generated by VCO 208.

Figure 6H:
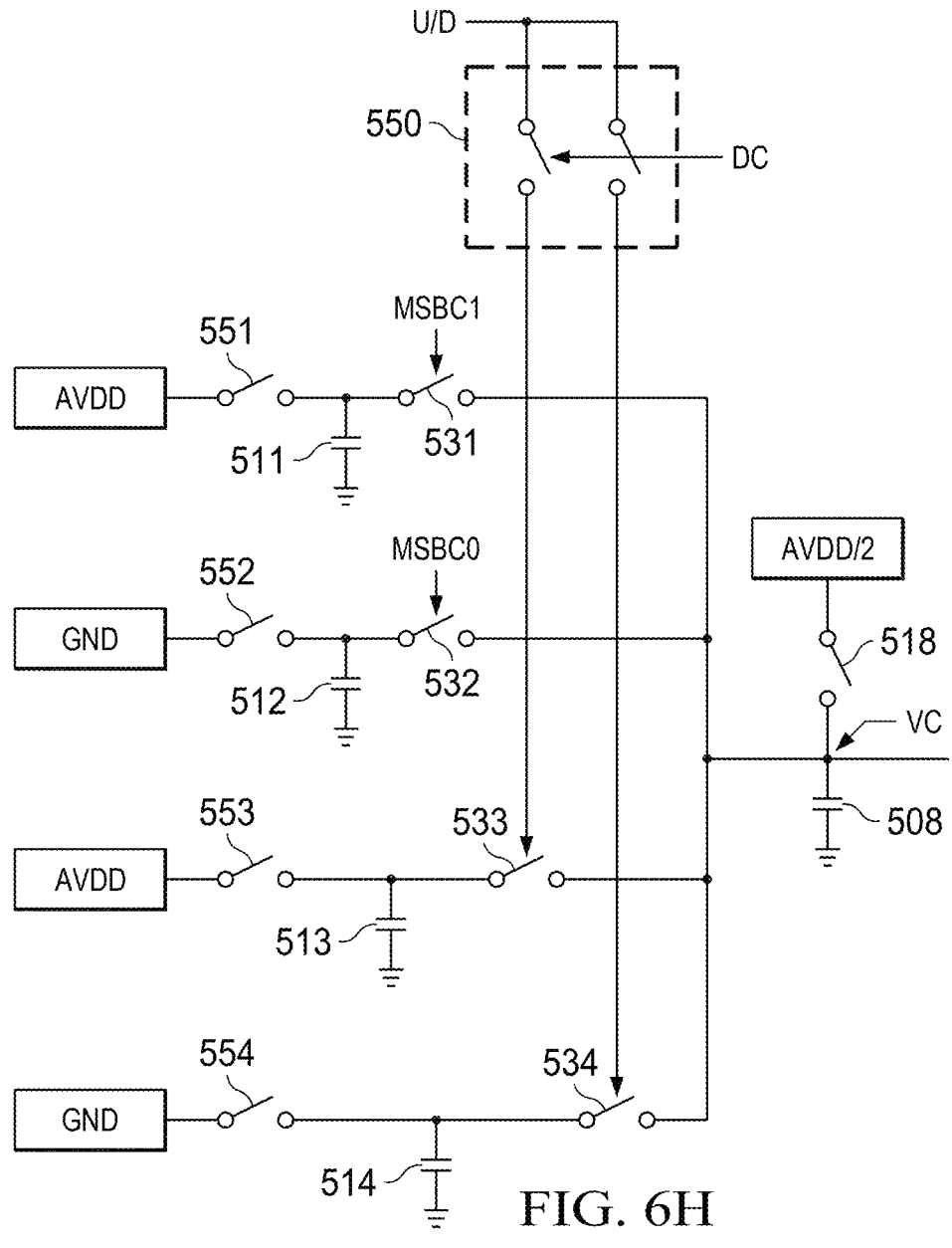

Referring back to FIG. 6A, if duty cycle comparator 506 determines in decision 607 that the duty cycle at the output of DSM 505 is at or near 50% (e.g., within $50\%\pm\Delta$), decision 607 returns a "yes" result and fine adjustment process block 610 is not performed. Because control signals U/D from DSM 505 continue to be issued, however, switches 533 and 534 may be opened or closed even if no adjustment is to be performed. To prevent unnecessary dithering in the output frequency $f_{OUT}$ when the duty cycle is at or near 50%, duty cycle comparator 506 issues control signal DC to gating circuit 540 to open its switches in this event, as shown in FIG. 6H. The open switches of gating circuit 540 in this event operate to block control signals U/D from DSM 505 from closing switches 533 and 534 in this 50% duty cycle condition. Counter 550 is then reset in a next instance of process block 600, and the operation of FIG. 6A is repeated.

The examples described above enable important advantages in the generation of clock signals in integrated circuits and systems. The "hybrid" operation of the example PLLs, in which frequency detection and correction is applied in a loop separate from phase detection, amplification of folded low frequency quantization noise can be avoided. Low frequency phase noise performance can be improved, and the power levels of close-in reference spurs can be reduced. The separation of frequency detection from phase detection also reduces the output swing at the charge pump input, improving the linearity of the charge pump itself, reducing folded quantization noise. Layout area of an integrated circuit including the example PLLs can also be substantially reduced, due to the elimination of the additional integrating capacitor in the loop filter of prior art designs. Scaling of the digital counter in digital implementations of the frequency control loop enables improved accuracy of the frequency detection and correction without significantly increasing layout area or power consumption.

Examples are described in this specification as implemented into a fractional PLL, as particular advantages are provided in that context. However, aspects of these examples may be beneficially applied in alternative applications, for example in integer PLLs and other types of clock generator circuits. Accordingly, the above description is provided by way of example only, and is not intended to limit the true scope as claimed.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means+/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some example embodiments, certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

Modifications are possible in the described examples, and other examples are possible, within the scope of the claims.

What is claimed is:

1. A phase-locked loop circuit, comprising
a phase detector having a reference clock input, a second input, and an output;
a charge pump having an input coupled to the output of the phase detector, and having an output;
a non-integrating loop filter having an input coupled to the output of the charge pump, and having an output;
a voltage adder having a first input coupled to the output of the loop filter, a second input, and an output;
a voltage-controlled oscillator (VCO) having an input coupled to the output of the voltage adder, and having an output;

a first frequency divider having an input coupled to the output of the VCO, and an output coupled to the second input of the phase detector; and
frequency control circuitry, having a first input coupled to the output of the VCO, a second input coupled to the reference clock input, and an output coupled to the second input of the voltage adder.

2. The circuit of claim 1, wherein the first frequency divider is a multi-modulus frequency divider; and wherein the circuit further comprises:
a register; and
a delta-sigma modulator (DSM) having a first input coupled to the output of the first frequency divider, a second input coupled to an output of the register, and an output coupled to a control input of the first frequency divider;
wherein the DSM is configured to output one of a lower divisor value and a higher divisor value for each cycle of a signal at the reference clock input responsive to contents of the register.

3. The circuit of claim 2, wherein the frequency control circuitry comprises:
frequency control logic, having a first input coupled to the output of the VCO, a second input configured to receive the signal of the reference clock input, and an output; and
a voltage adjustment circuit, having an input coupled to the frequency control logic and a voltage output coupled to the second input of the voltage adder.

4. The circuit of claim 3, wherein the frequency control logic comprises:
a second frequency divider, having an input coupled to the output of the VCO, the second frequency divider configured to output a signal at a frequency divided down by a value corresponding to the higher divisor value; and
a counter/comparator having a clock input configured to receive a clock signal corresponding to the signal of the reference clock input and a data input coupled to an output of the second frequency divider;
wherein the input of the voltage adjustment circuit is coupled to a first output of the counter/comparator.

5. The circuit of claim 4, wherein the voltage adjustment circuit comprises:
a first capacitor having a terminal coupled to a power supply terminal;
a first switch having a first terminal coupled to the first capacitor, a second terminal coupled to the second input of the voltage adder, and a control terminal;
a second capacitor having a terminal coupled to a common terminal;
a second switch having a first terminal coupled to the second capacitor, a second terminal coupled to the second input of the voltage adder, and a control terminal; and
a main capacitor having a terminal coupled to a reference voltage terminal and to the second input of the voltage adder;
wherein the first output of the counter/comparator is coupled to the control terminals of the first and second switches.

6. The circuit of claim 5, wherein the frequency control logic further comprises:
a second delta-sigma modulator (DSM) having an input coupled to a second output of the counter/comparator;
and wherein the voltage adjustment circuit further comprises:

a third capacitor having a terminal coupled to the power supply terminal;

a third switch having a first terminal coupled to the third capacitor, a second terminal coupled to the second input of the voltage adder, and a control terminal;

a fourth capacitor having a terminal coupled to the common terminal;

a fourth switch having a first terminal coupled to the fourth capacitor, a second terminal coupled to the second input of the voltage adder, and a control terminal; and wherein the output of the second DSM is coupled to the control terminals of the third and fourth switches.

7. The circuit of claim 6, wherein the first output of the counter/comparator is configured to output a result corresponding to most significant bits in the counter/comparator;

wherein the second output of the counter/comparator is configured to output a result corresponding to least significant bits in the counter/comparator;

and wherein the third and fourth capacitors have smaller capacitances than the first and second capacitors.

8. The circuit of claim 7, wherein the frequency control logic further comprises:

a comparator having an input coupled to the output of the second DSM;

and wherein the voltage adjustment circuit further comprises:

gating circuitry having a first terminal coupled to the second output of the second DSM, a second terminal coupled to control inputs of the third and fourth switches, and a control terminal coupled to an output of the comparator.

9. A phase-locked loop circuit, comprising:

a phase detector having a first input configured to receive a reference clock signal, a second input configured to receive a feedback clock signal, and an output;

a charge pump having an input coupled to the output of the phase detector, and having an output;

a non-integrating loop filter having an input coupled to the output of the charge pump;

a voltage adder having a first input coupled to an output of the loop filter, a second input, and an output;

a voltage-controlled oscillator (VCO) configured to output an output clock signal at a phase and frequency corresponding to a voltage at an output of the voltage adder;

a feedback circuit having an input coupled to an output of the VCO, the feedback circuit configured to output, to a second input of the phase detector, a feedback clock signal at a frequency divided from the output clock signal by a divisor value; and frequency control circuitry, having a first input configured to receive the output clock signal, a second input configured to receive the reference clock signal, the frequency control circuitry configured to apply a voltage to the second input of the voltage adder responsive to a comparison of a frequency of the output clock signal with a product of a frequency of the reference clock signal and the divisor value.

10. The circuit of claim 9, wherein the frequency control circuitry comprises:

frequency control logic, having a first input coupled to the output of the VCO, a second input configured to receive the reference clock signal, and an output; and voltage adjustment circuit, having an input coupled to the frequency control logic and a voltage output coupled to the second input of the voltage adder.

11. The circuit of claim 10, wherein the feedback circuit comprises:

a multi-modulus frequency divider having an input configured to receive the output clock signal, a control input, and an output configured to provide the feedback clock signal to the second input of the phase detector;

a register storing a fractional portion of the divisor value; and a delta-sigma modulator (DSM) having a first input coupled to the output of the multi-modulus frequency divider, a second input coupled to an output of the register, and an output coupled to the control input of the multi-modulus frequency divider, the DSM configured to output one of a lower divisor and a higher divisor, alternating at a frequency responsive to the fractional portion stored in the register.

12. The circuit of claim 11, wherein the frequency control logic comprises:

a first frequency divider, having an input configured to receive the output clock signal, the first frequency divider configured to divide the output clock signal by a value corresponding to the higher divisor; and a counter/comparator having a clock input configured to receive a clock signal corresponding to the reference clock signal, a data input coupled to an output of the first frequency divider, and an output, the counter configured to output a signal corresponding to a comparison of a number of clock edges at the output of the first frequency divider over a selected number of cycles of the clock signal with an expected number corresponding to the divisor value;

wherein the input of the voltage adjustment circuit is coupled to a first output of the counter/comparator.

13. The circuit of claim 12, wherein the voltage adjustment circuit comprises:

a first capacitor having a terminal configured to receive a power supply voltage;

a first switch having a first terminal coupled to the first capacitor, a second terminal coupled to the second input of the voltage adder, and a control terminal;

a second capacitor having a terminal configured to receive a common potential;

a second switch having a first terminal coupled to the second capacitor, a second terminal coupled to the second input of the voltage adder, and a control terminal; and a main capacitor having a terminal configured to receive a selected voltage and coupled to the second input of the voltage adder;

wherein the first output of the counter/comparator is coupled to the control terminals of the first and second switches.

14. The circuit of claim 13, wherein the frequency control logic further comprises:

a second DSM having an input coupled to a second output of the counter/comparator;

and wherein the voltage adjustment circuit further comprises:

a third capacitor having a terminal configured to receive the power supply voltage;

a third switch having a first terminal coupled to the third capacitor, a second terminal coupled to the second input of the voltage adder, and a control terminal;

a fourth capacitor having a terminal configured to receive the common potential;

a fourth switch having a first terminal coupled to the fourth capacitor, a second terminal coupled to the second input of the voltage adder, and a control terminal; and wherein the output of the second DSM is coupled to the control terminals of the third and fourth switches.

15. The circuit of claim 14, wherein the first output of the counter/comparator is configured to output result corresponding to most significant bits in the counter/comparator;

wherein the second output of the counter is configured to output a result corresponding to least significant bits in the counter/comparator;

and wherein the third and fourth capacitors have smaller capacitances than the first and second capacitors.

16. The circuit of claim 15, wherein the frequency control logic further comprises:

a comparator having an input coupled to the output of the second DSM;

and wherein the voltage adjustment circuit further comprises:

gating circuitry having a first terminal coupled to the second output of the second DSM, a second terminal coupled to control inputs of the third and fourth switches, and a control terminal coupled to an output of the comparator.

17. A method, comprising:

detecting a phase difference between an input signal and a feedback signal;

controlling a charge pump responsive to the detected phase difference;

filtering an output voltage from the charge pump with a non-integrating filter to produce a first voltage controlled oscillator (VCO) input voltage;

generating an output signal from a VCO responsive to a sum of the first VCO input voltage and a second VCO input voltage, wherein the sum is generated by a voltage adder;

generating the feedback signal by dividing down a frequency of the output signal by a divisor value; and generating the second VCO input voltage responsive to a comparison of a frequency of the output signal with a product of the frequency of the input signal and the divisor value.

18. The method of claim 17, wherein the generating of the feedback signal comprises:

applying the output signal to an input of a multi-modulus frequency divider; and alternately applying one of a lower divisor value and a higher divisor value to a control input of the multi-modulus frequency divider at a frequency corresponding to the divisor value;

and wherein the generating of the second VCO input voltage comprises:

dividing down the frequency of the output signal by the higher divisor value to produce a data signal;

counting a number of clock edges of the data signal occurring in a selected number of cycles of the input signal;

comparing the counted number of clock edges with an expected number corresponding to the divisor value; and generating the second VCO input voltage responsive to a result of the comparing.

19. The method of claim 18, wherein a first input of the voltage adder receives the first VCO input voltage, and an output of the voltage adder is coupled to an input of the VCO;

and wherein the generating of the second VCO input voltage responsive to a result of the comparing comprises:

charging, to a midpoint voltage, a main capacitor coupled to a second input of a voltage adder;

charging a first capacitor to a voltage higher than the midpoint voltage;

charging a second capacitor to a voltage lower than the midpoint voltage;

responsive to the comparing indicating a count of fewer clock edges than the expected number, coupling the first capacitor to the second input of the voltage adder; and responsive to the comparing indicating a count of more clock edges than the expected number, coupling the second capacitor to the second input of the voltage adder.

20. The method of claim 19, wherein the number of clock edges corresponds to a digital value of k most significant bits and b least significant bits;

and wherein the generating of the second VCO input voltage responsive to a result of the comparing further comprises:

charging a third capacitor to a voltage higher than the midpoint voltage;

charging a fourth capacitor to a voltage lower than the midpoint voltage;

responsive to the comparing indicating a count of the expected number of clock edges within the k most significant bits:

isolating the first and second capacitors from the second input of the voltage adder;

responsive to the comparing indicating a count of fewer clock edges than the expected number within the b least significant bits, coupling the third capacitor to the second input of the voltage adder;

responsive to the comparing indicating a count of more clock edges than the expected number within the b least significant bits, coupling the fourth capacitor to the second input of the voltage adder;

monitoring a duty cycle of the result of comparing the count of clock edges with the expected number within the b least significant bits; and responsive to the monitored duty cycle being about 50%, blocking the coupling of the third and fourth capacitors to the second input of the voltage adder.

21. A phase-locked loop circuit, comprising:

a phase detector having a reference clock input, a second input, and an output;

a charge pump having an input coupled to the output of the phase detector, and having an output;

a non-integrating loop filter having an input coupled to the output of the charge pump, and having an output;

a voltage adder having a first input coupled to the output of the loop filter, a second input, and an output;

a voltage-controlled oscillator (VCO) having an input coupled to the output of the voltage adder, and having an output;

a first frequency divider having an input coupled to the output of the VCO, and an output coupled to the second input of the phase detector;

a register;

a first delta-sigma modulator (DSM) having a first input coupled to the output of the first frequency divider, a second input coupled to an output of the register, and an output coupled to a control input of the first frequency divider, wherein the first DSM is configured to output one of a lower divisor value and a higher divisor value for each cycle of a signal at the reference clock input responsive to contents of the register;

a second frequency divider, having an input coupled to the output of the VCO, the second frequency divider configured to output a signal at a frequency divided down by a value corresponding to the higher divisor value; and a counter/comparator having a clock input configured to receive a clock signal corresponding to the signal of the reference clock input, a data input coupled to an output of the second frequency divider, and first and second outputs;

a first capacitor having a terminal coupled to a power supply terminal;

a first switch having a first terminal coupled to the first capacitor, a second terminal coupled to the second input of the voltage adder, and a control terminal coupled to a first output of the counter/comparator;

a second capacitor having a terminal coupled to a common terminal;

a second switch having a first terminal coupled to the second capacitor, a second terminal coupled to the second input of the voltage adder, and a control terminal coupled to the first output of the counter/comparator; and a main capacitor having a terminal coupled to a reference voltage terminal and to the second input of the voltage adder;

a second DSM having an input coupled to the second output of the counter, and having an output;

a third capacitor having a terminal coupled to the power supply terminal;

a third switch having a first terminal coupled to the third capacitor, a second terminal coupled to the second input of the voltage adder, and a control terminal coupled to the output of the second DSM;

a fourth capacitor having a terminal coupled to the common terminal; and a fourth switch having a first terminal coupled to the fourth capacitor, a second terminal coupled to the second input of the voltage adder, and a control terminal coupled to the output of the second DSM.

* * * * *